United States Patent
Hu et al.

(10) Patent No.: US 10,998,264 B2
(45) Date of Patent: May 4, 2021

(54) DUAL-GATE TRENCH IGBT WITH BURIED FLOATING P-TYPE SHIELD

(71) Applicant: Alpha and Omega Semiconductor Incorporated, Sunnyvale, CA (US)

(72) Inventors: Jun Hu, San Bruno, CA (US); Madhur Bobde, San Jose, CA (US); Hamza Yilmaz, Saratoga, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 17/060,083

(22) Filed: Oct. 1, 2020

(65) Prior Publication Data

US 2021/0020567 A1 Jan. 21, 2021

Related U.S. Application Data

(60) Division of application No. 16/258,652, filed on Jan. 27, 2019, which is a continuation of application No.
(Continued)

(51) Int. Cl.

| | |
|---|---|
| *H01L 29/66* | (2006.01) |
| *H01L 29/10* | (2006.01) |
| *H01L 29/739* | (2006.01) |
| *H01L 23/522* | (2006.01) |
| *H01L 23/00* | (2006.01) |

(Continued)

(52) U.S. Cl.
CPC ........ *H01L 23/5226* (2013.01); *H01L 21/561* (2013.01); *H01L 23/3128* (2013.01); *H01L 23/5283* (2013.01); *H01L 24/09* (2013.01); *H01L 24/17* (2013.01); *H01L 24/33* (2013.01); *H01L 24/73* (2013.01); *H01L 24/97* (2013.01); *H01L 29/1095* (2013.01); *H01L 29/66348* (2013.01); *H01L 29/7393* (2013.01); *H01L 2224/0231* (2013.01); *H01L 2224/02373* (2013.01); *H01L 2224/02379* (2013.01)

(58) Field of Classification Search
CPC ........... H01L 29/42352; H01L 29/4236; H01L 29/42356; H01L 29/42336; H01L 29/7813; H01L 29/1095; H01L 29/7825; H01L 29/7393; H01L 29/66348
See application file for complete search history.

(56) References Cited

U.S. PATENT DOCUMENTS

| | | | | |
|---|---|---|---|---|
| 2006/0281249 A1* | 12/2006 | Yilmaz | ............. | H01L 29/66727 438/243 |
| 2009/0085103 A1* | 4/2009 | Hille | ................... | H01L 29/6634 257/330 |

* cited by examiner

*Primary Examiner* — Marcos D. Pizarro
*Assistant Examiner* — Antonio B Crite
(74) *Attorney, Agent, or Firm* — Bo-In Lin

(57) ABSTRACT

A method of manufacturing an insulated gate bipolar transistor (IGBT) device comprising 1) preparing a semiconductor substrate with an epitaxial layer of a first conductivity type supported on the semiconductor substrate of a second conductivity type; 2) applying a gate trench mask to open a first trench and second trench followed by forming a gate insulation layer to pad the trench and filling the trench with a polysilicon layer to form the first trench gate and the second trench gate; 3) implanting dopants of the first conductivity type to form an upper heavily doped region in the epitaxial layer; and 4) forming a planar gate on top of the first trench gate and apply implanting masks to implant body dopants and source dopants to form a body region and a source region near a top surface of the semiconductor substrate.

20 Claims, 29 Drawing Sheets

Present Invention

Related U.S. Application Data

15/600,782, filed on May 21, 2017, now Pat. No. 10,199,455, which is a division of application No. 14/712,599, filed on May 14, 2015, now Pat. No. 9,666,666, which is a division of application No. 13/831,066, filed on Mar. 14, 2013, now Pat. No. 9,048,282, which is a division of application No. 12/925,869, filed on Oct. 31, 2010, now Pat. No. 8,441,046.

(51) Int. Cl.
*H01L 23/528* (2006.01)
*H01L 21/56* (2006.01)
*H01L 23/31* (2006.01)

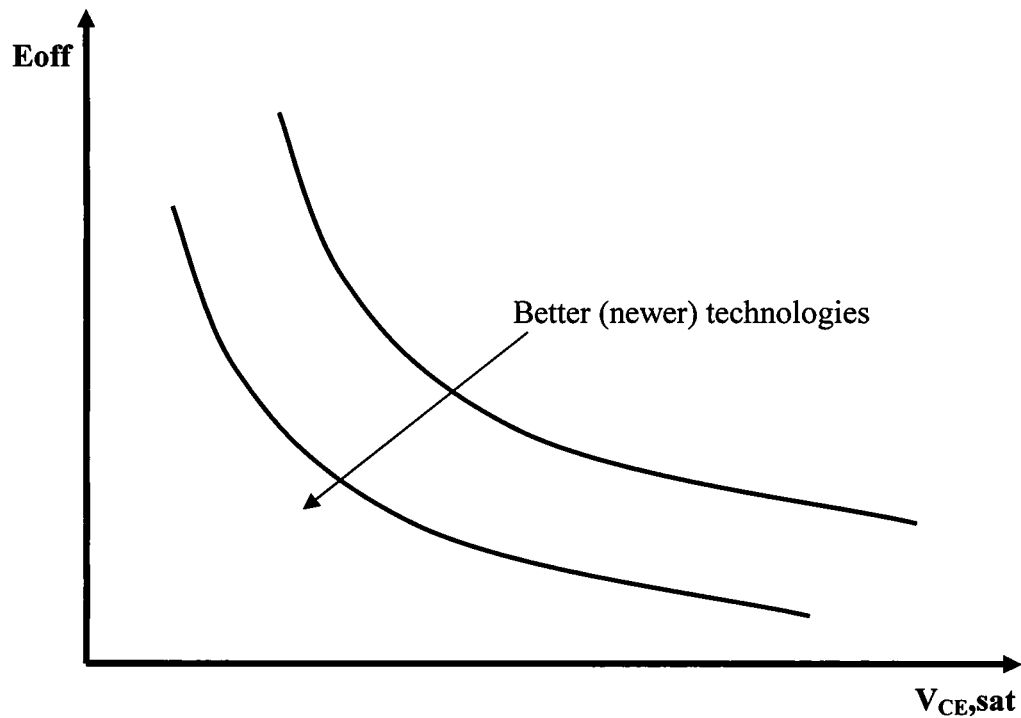
Fig. 1D
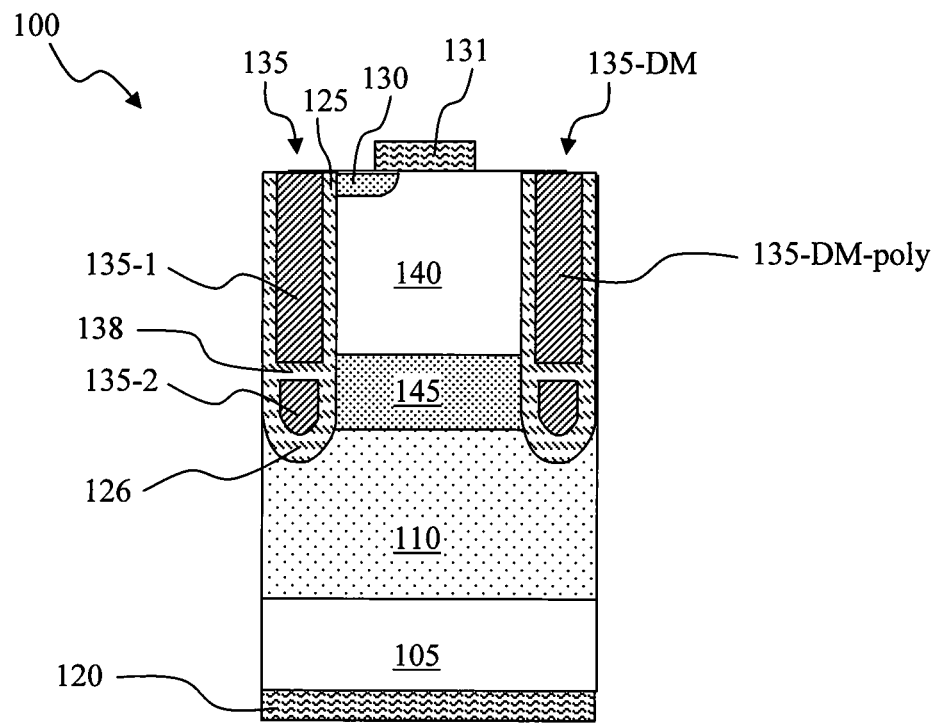
Fig. 2 Present Invention

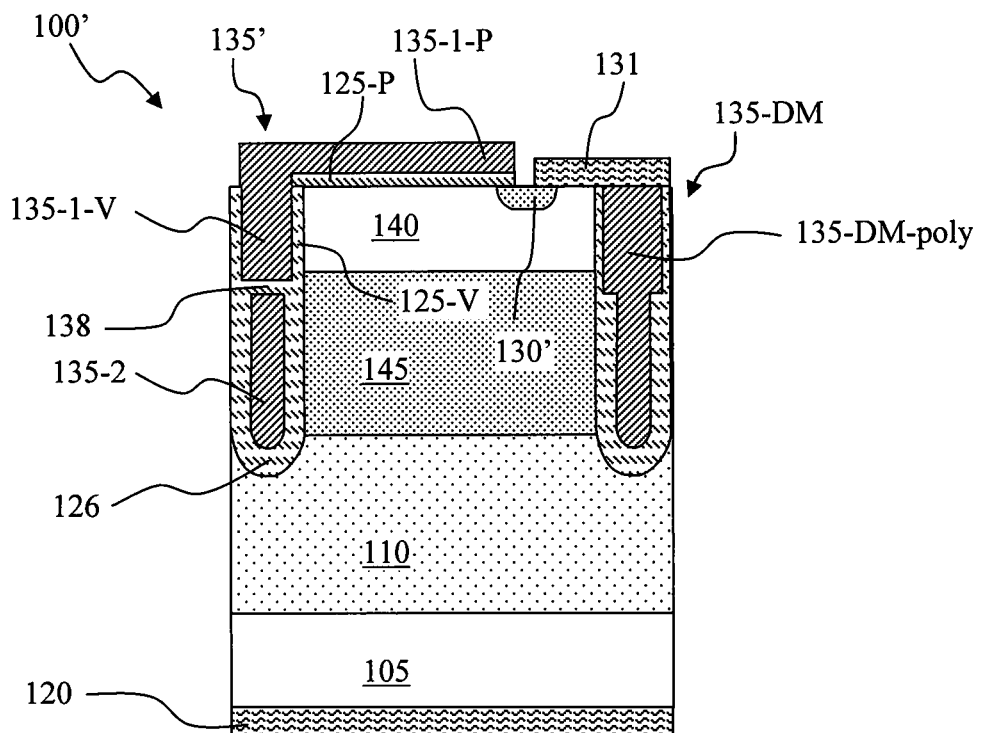
Fig. 3A Present Invention
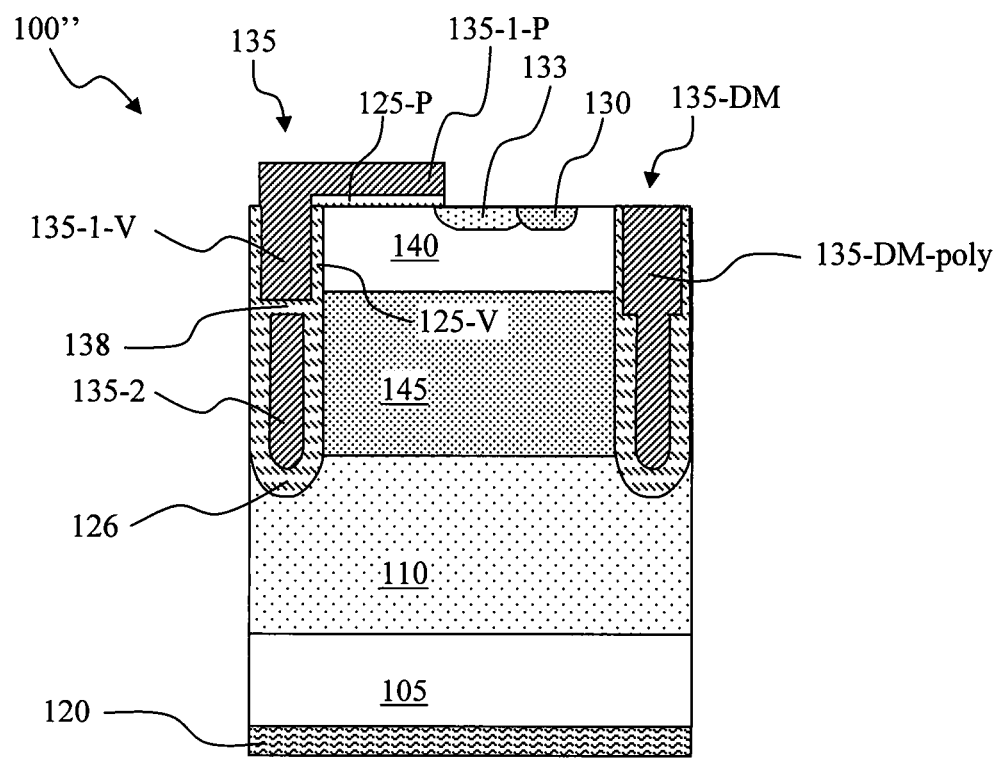
Fig. 3B Present Invention

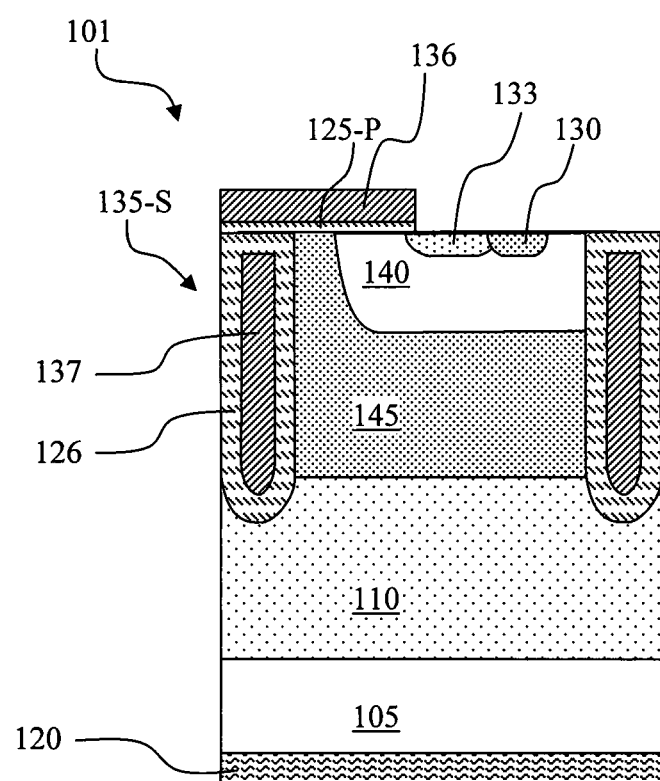
Fig. 4 Present Invention

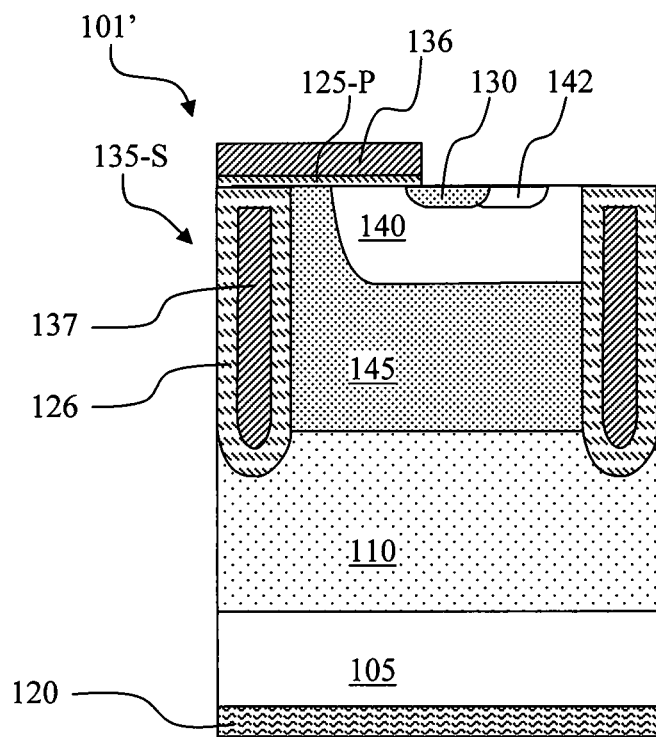
Fig. 5 Present Invention
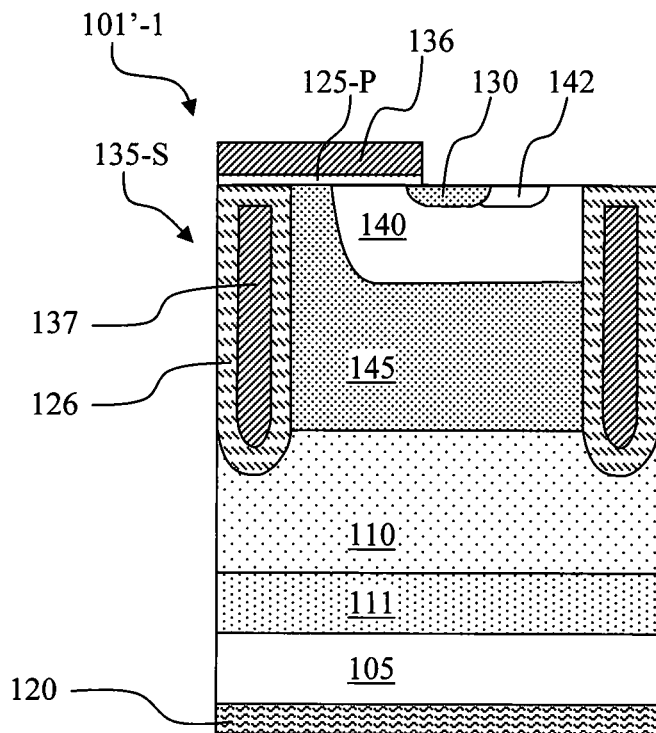
Fig. 5-1 Present Invention

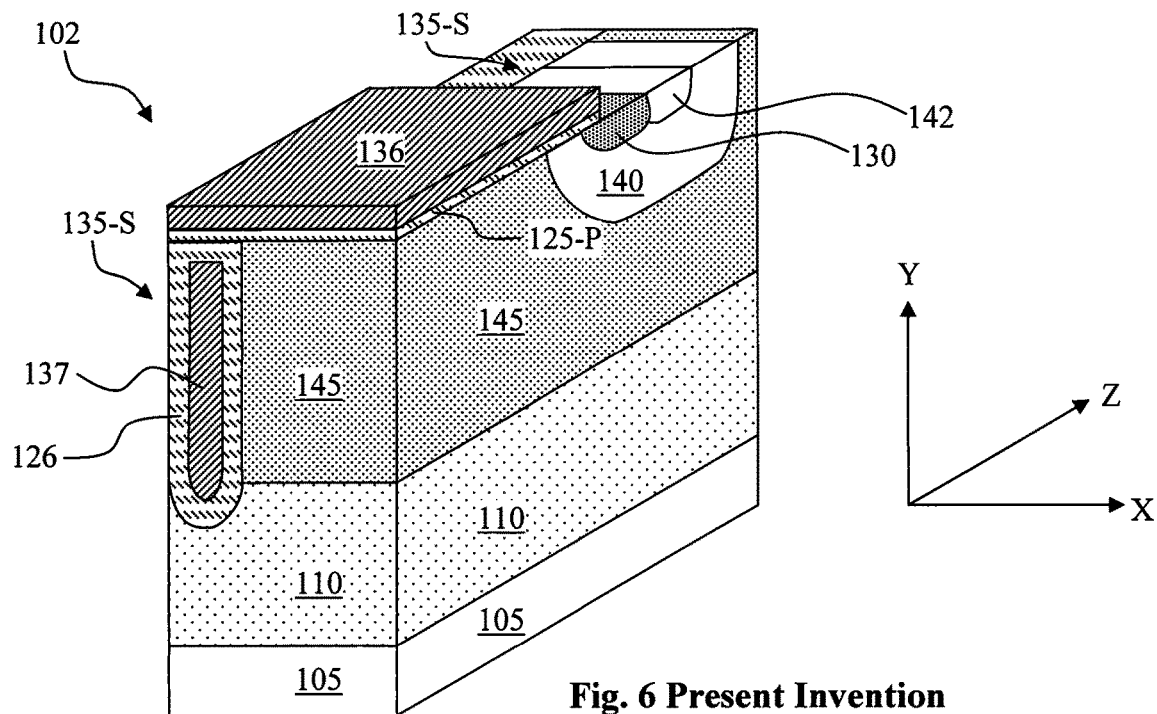
Fig. 6 Present Invention
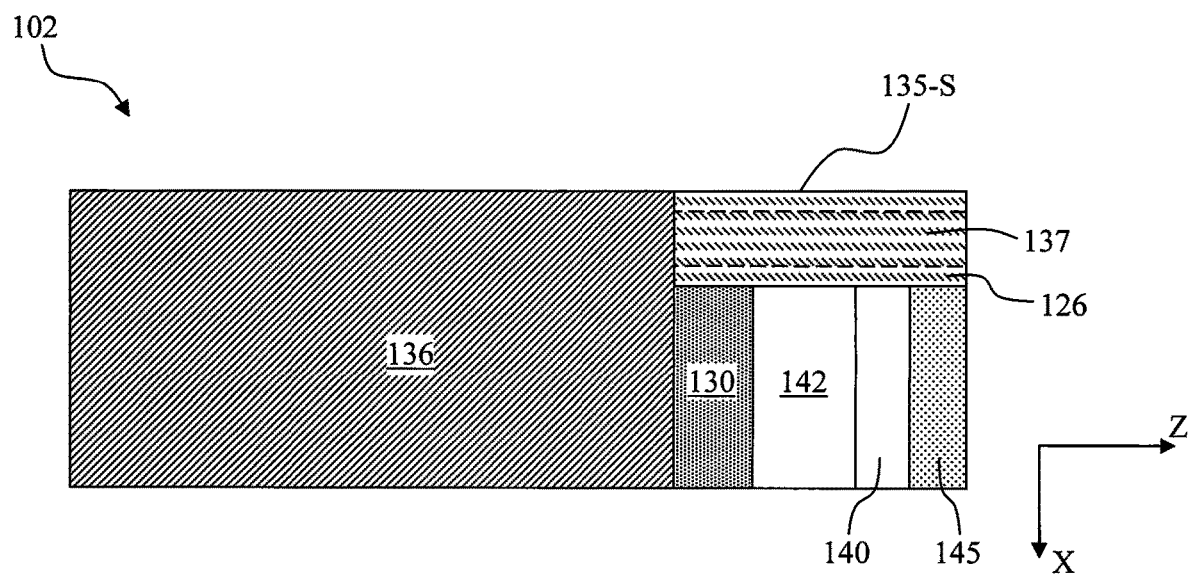
Fig. 7A Present Invention

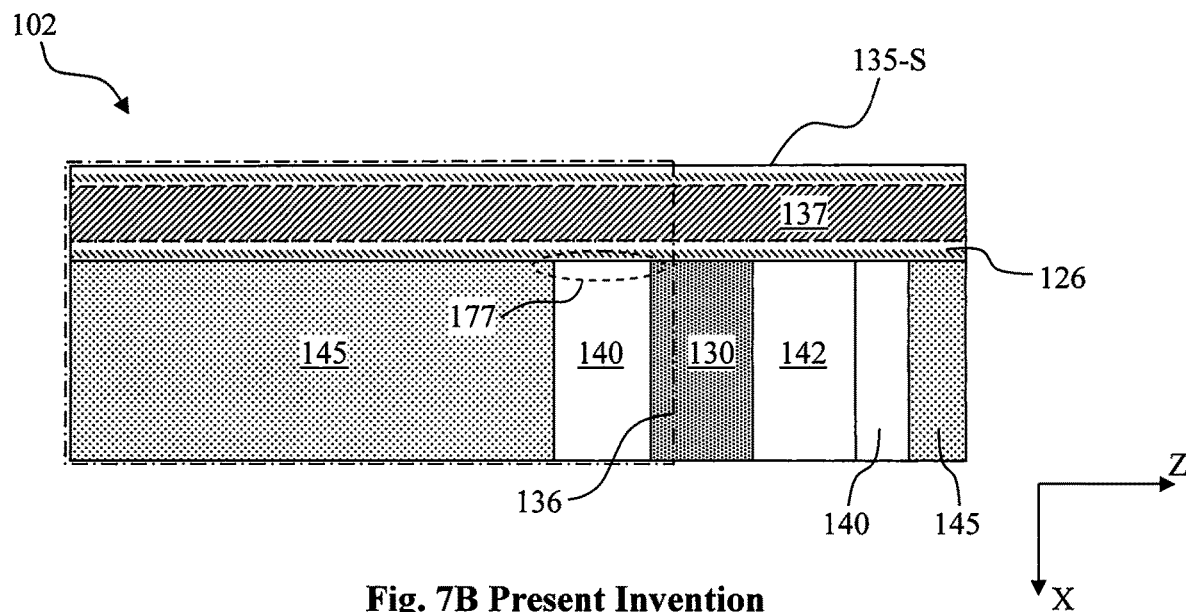
Fig. 7B Present Invention
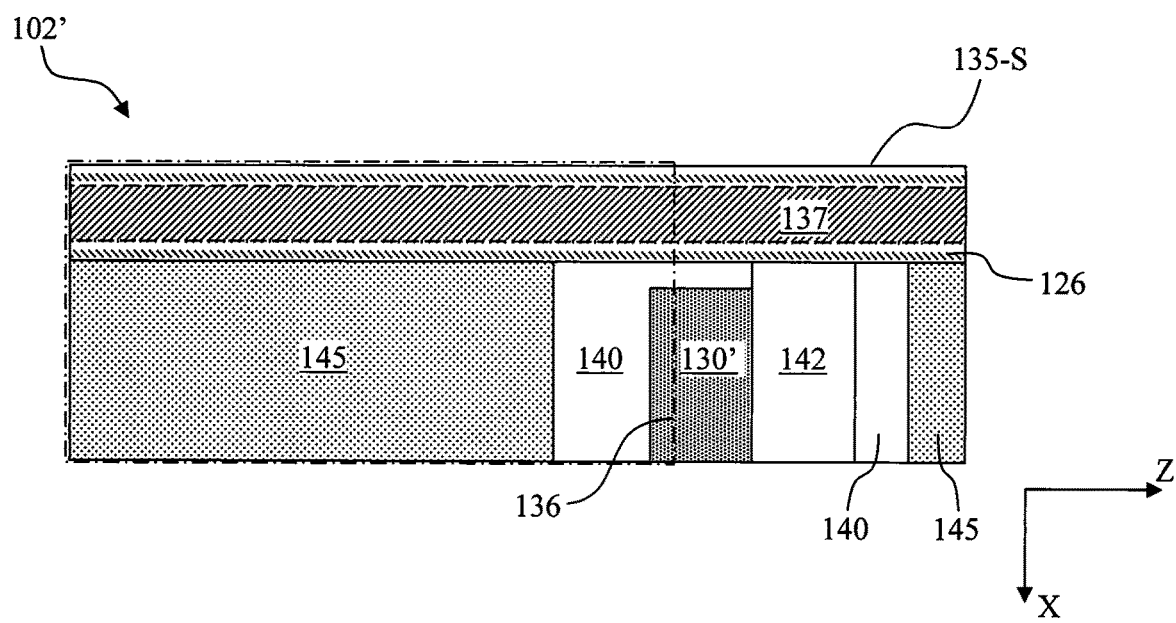
Fig. 7C Present Invention

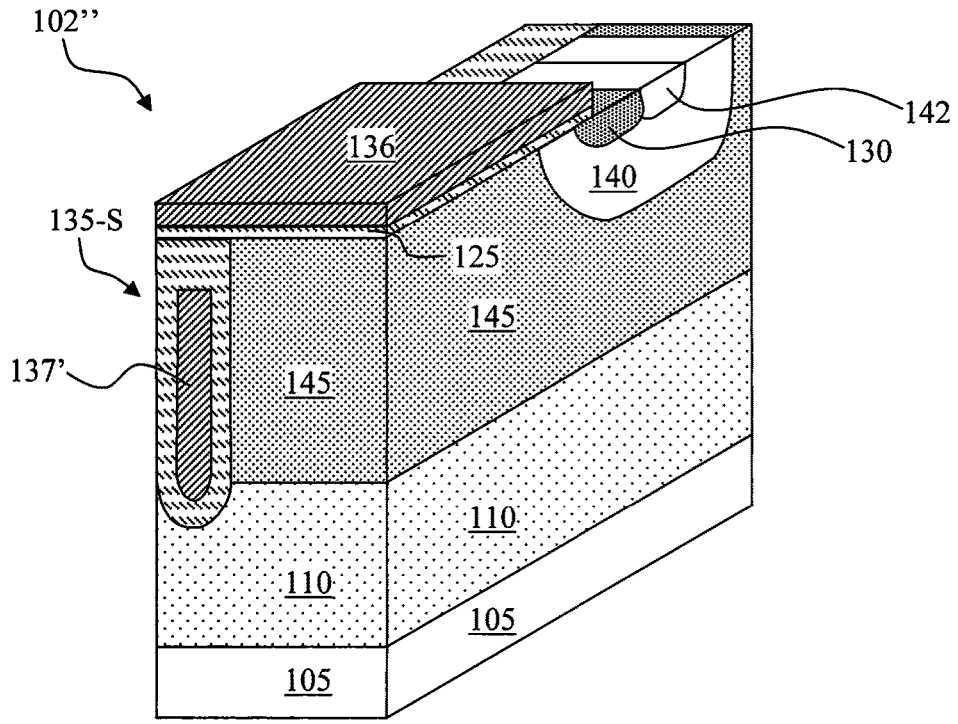
Fig. 7D Present Invention
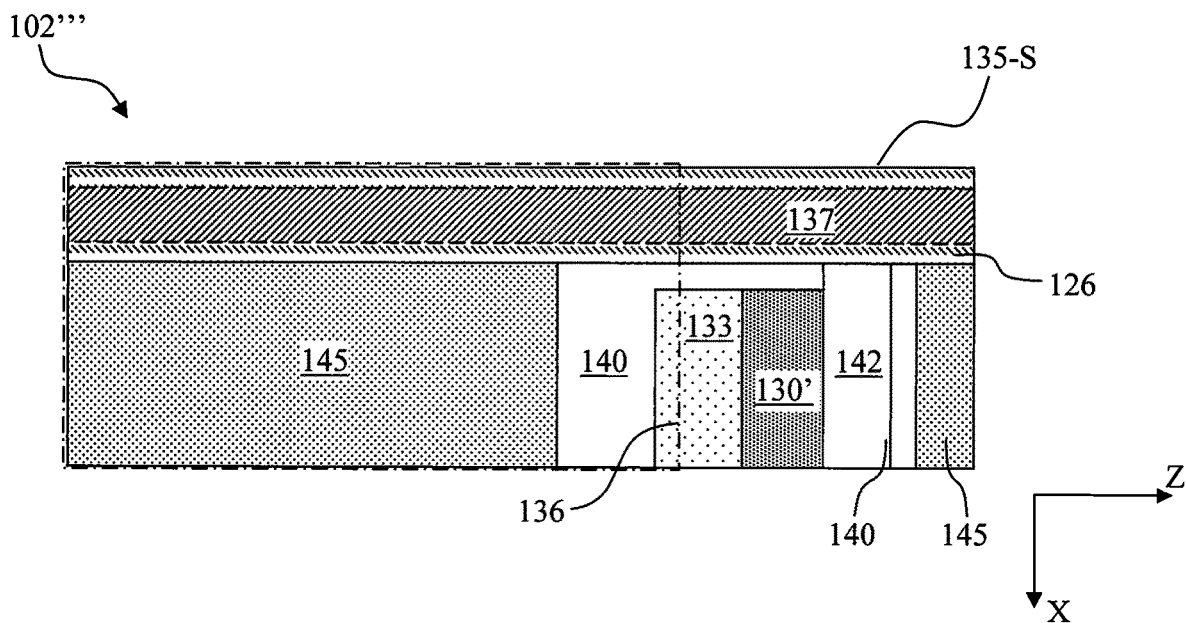
Fig. 7E Present Invention

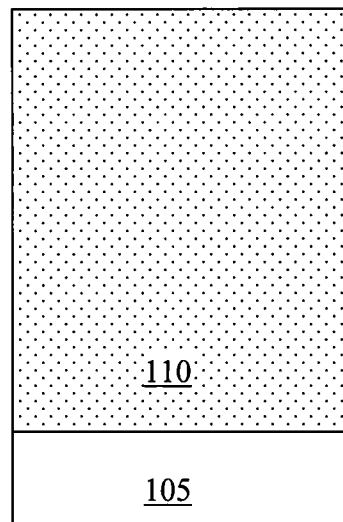
Fig. 8A Present Invention
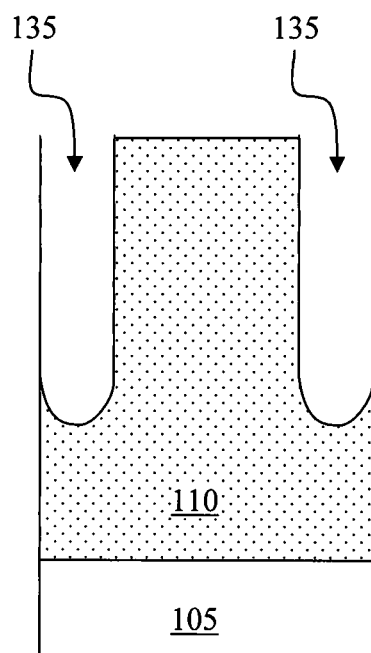
Fig. 8B Present Invention

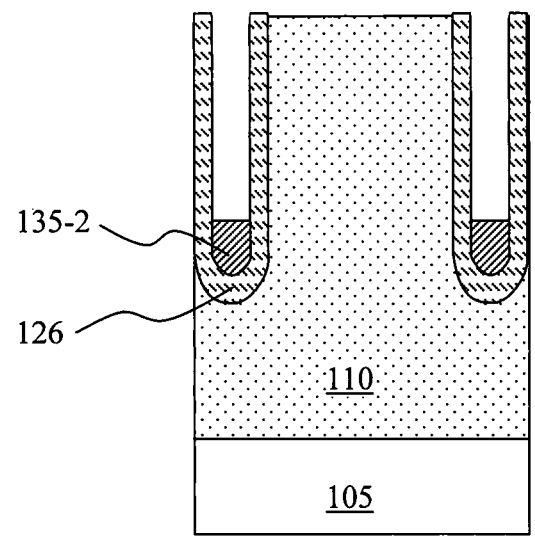
Fig. 8C Present Invention
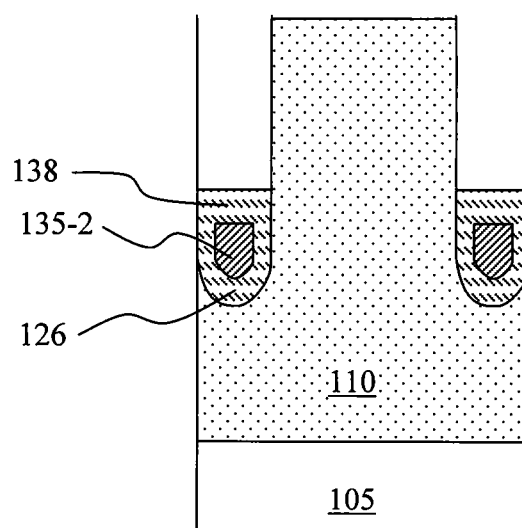
Fig. 8D Present Invention

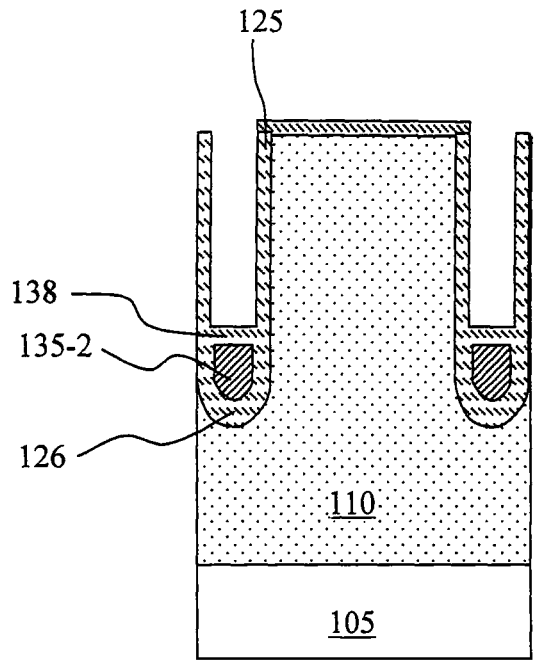
Fig. 8E Present Invention
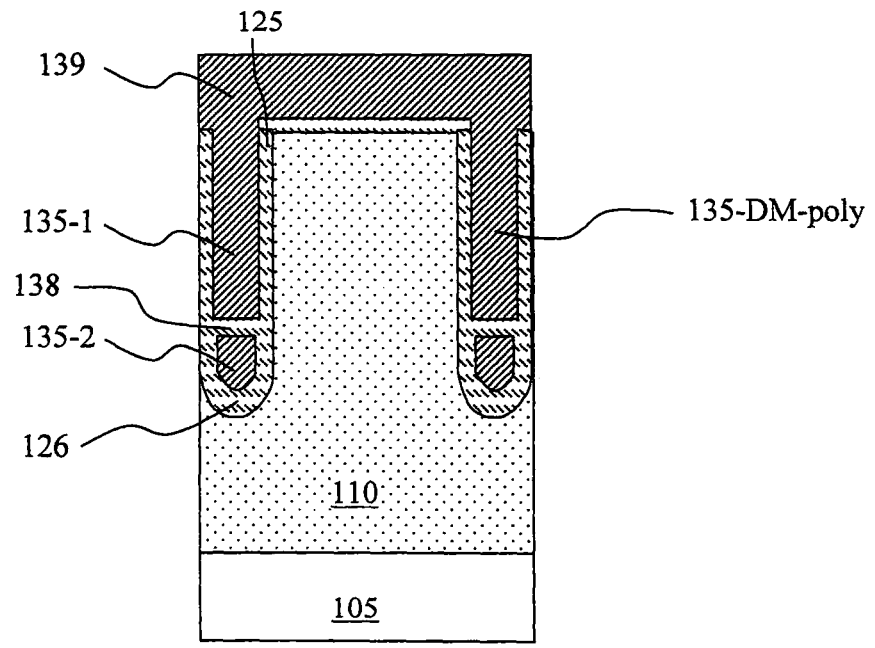
Fig. 8F Present Invention

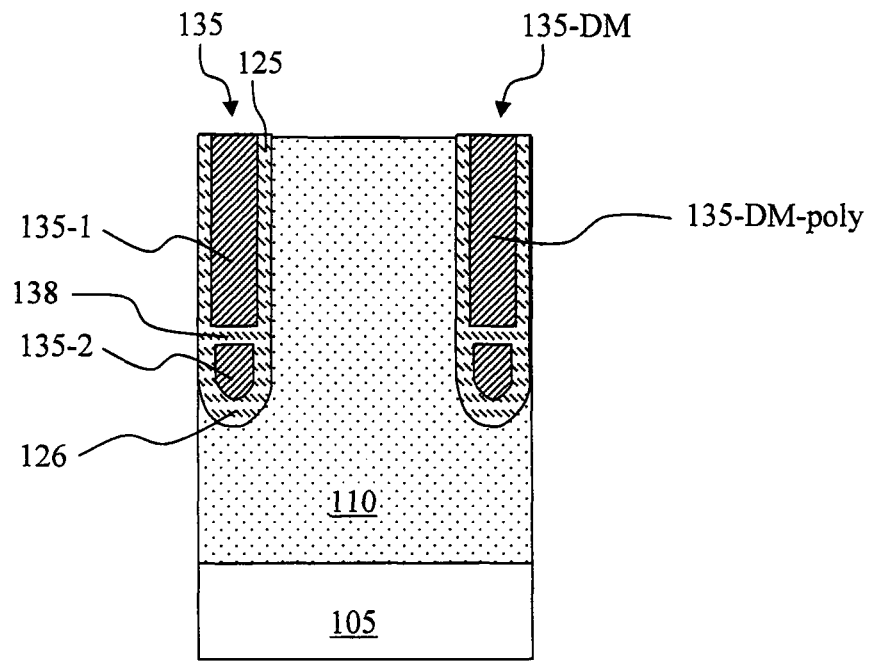
Fig. 8G Present Invention
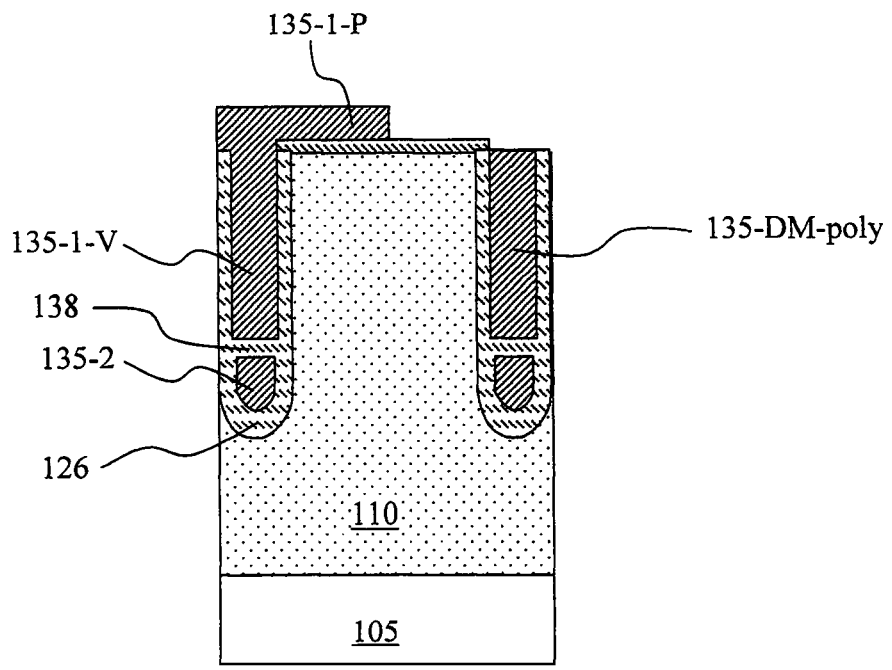
Fig. 8G-1 Present Invention

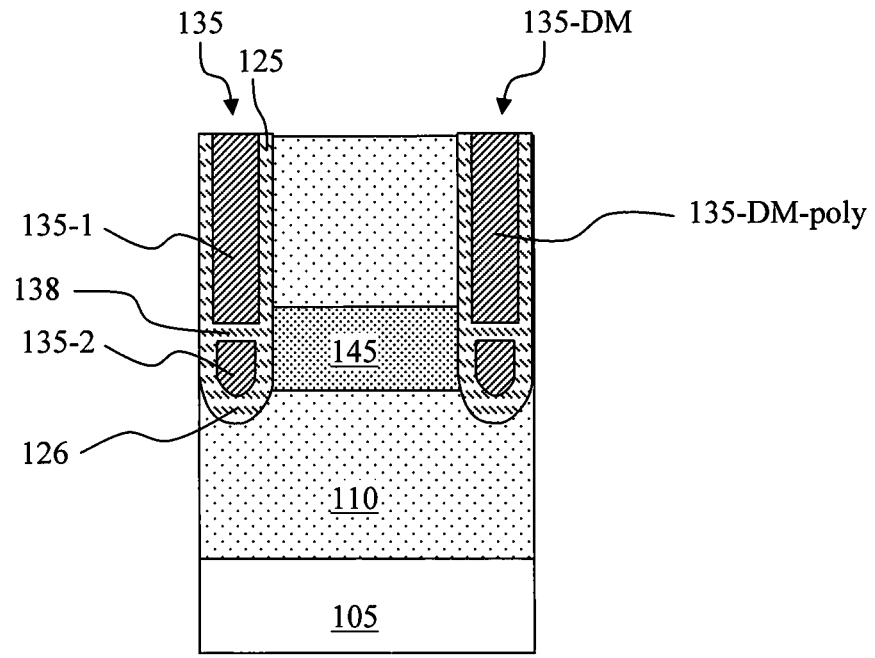
Fig. 8H Present Invention
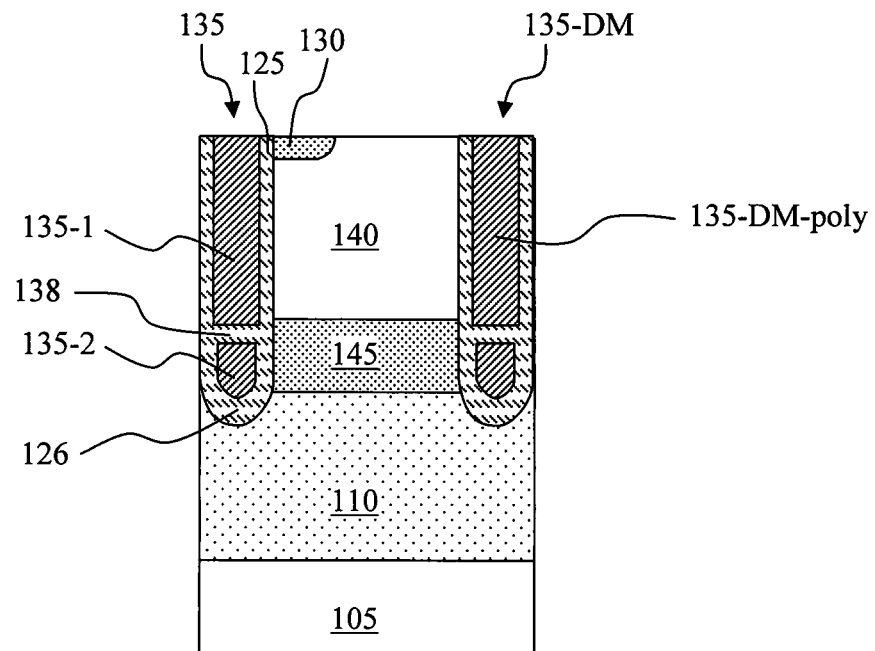
Fig. 8I Present Invention

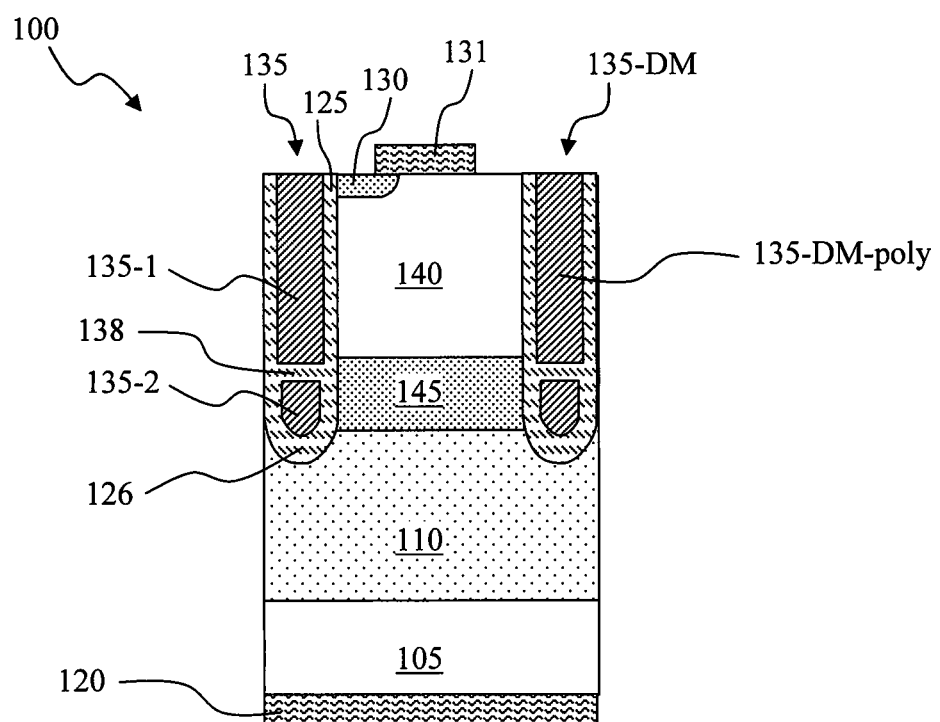
Fig. 8J Present Invention

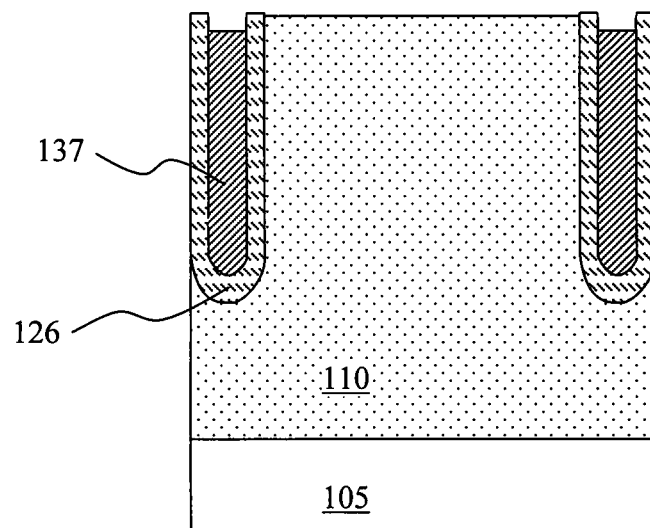
Fig. 9A Present Invention
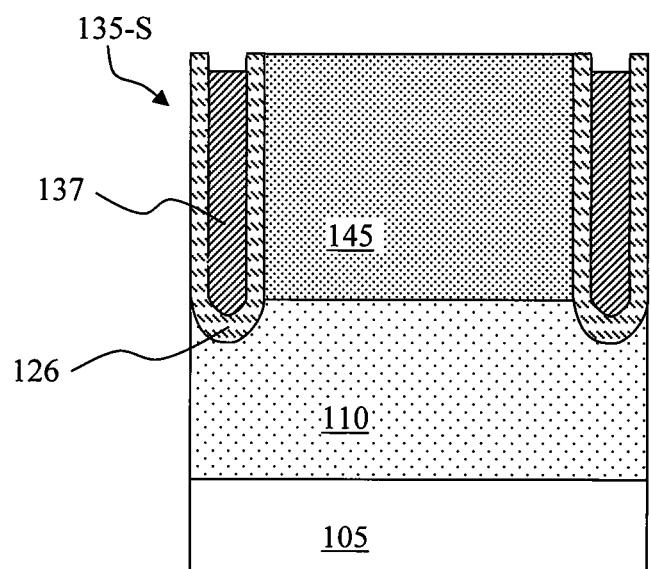
Fig. 9B Present Invention

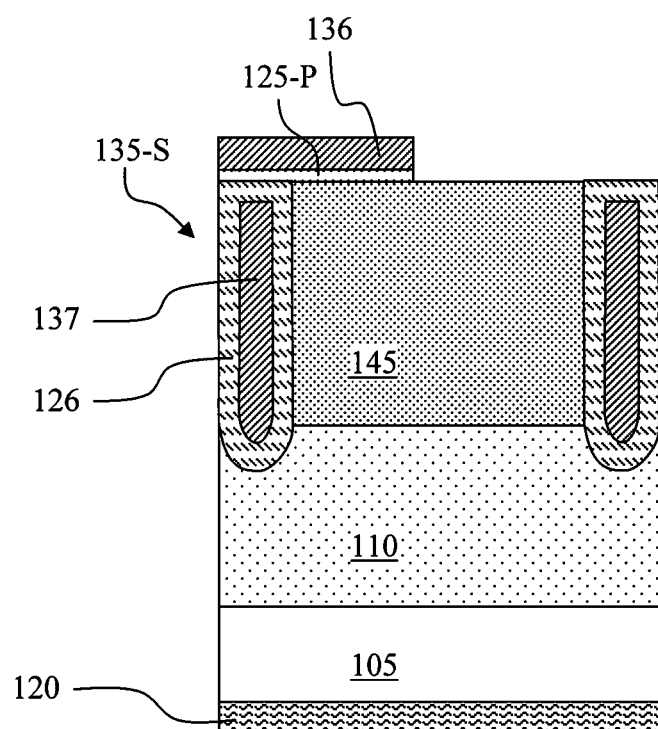
Fig. 9C Present Invention
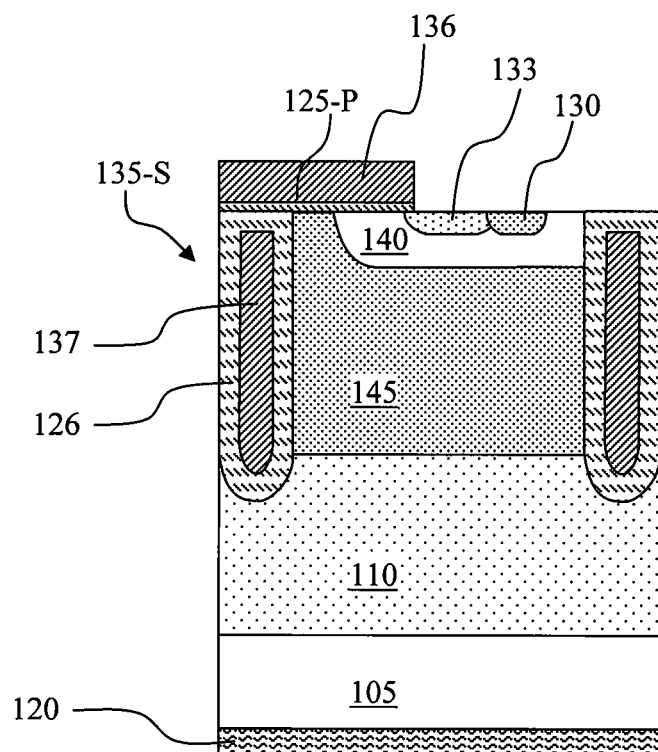
Fig. 9D Present Invention

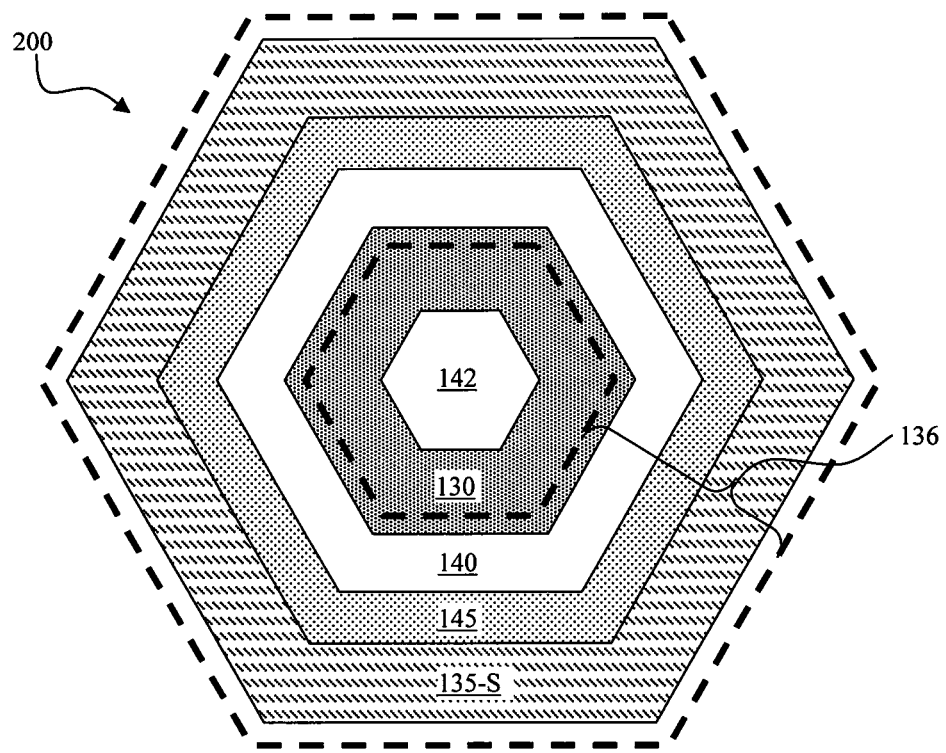
Fig. 10A Present Invention
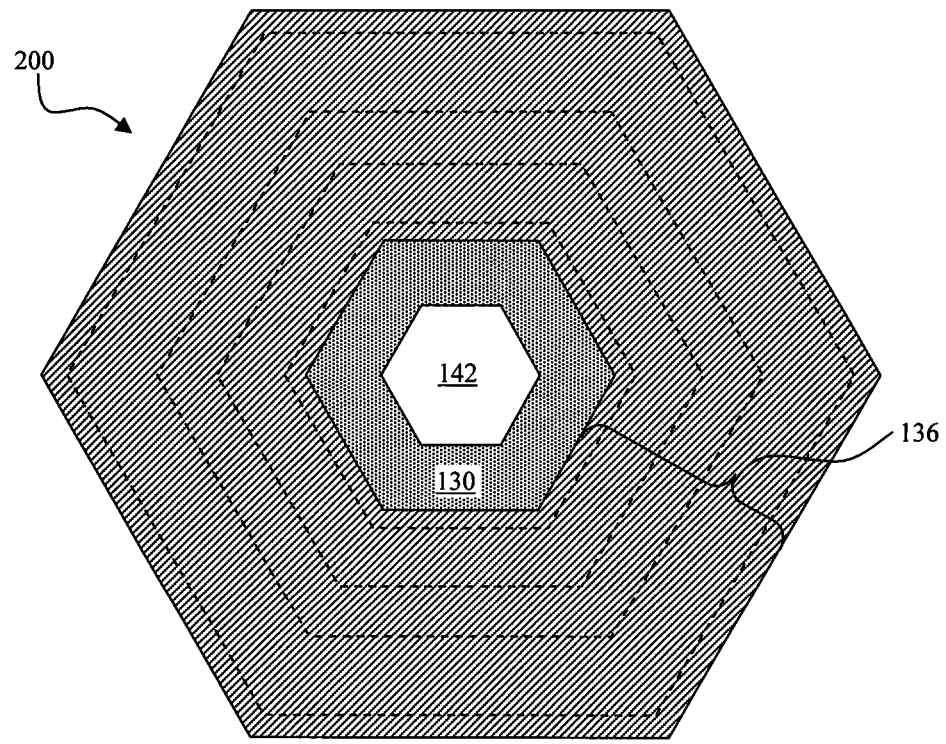
Fig. 10B Present Invention

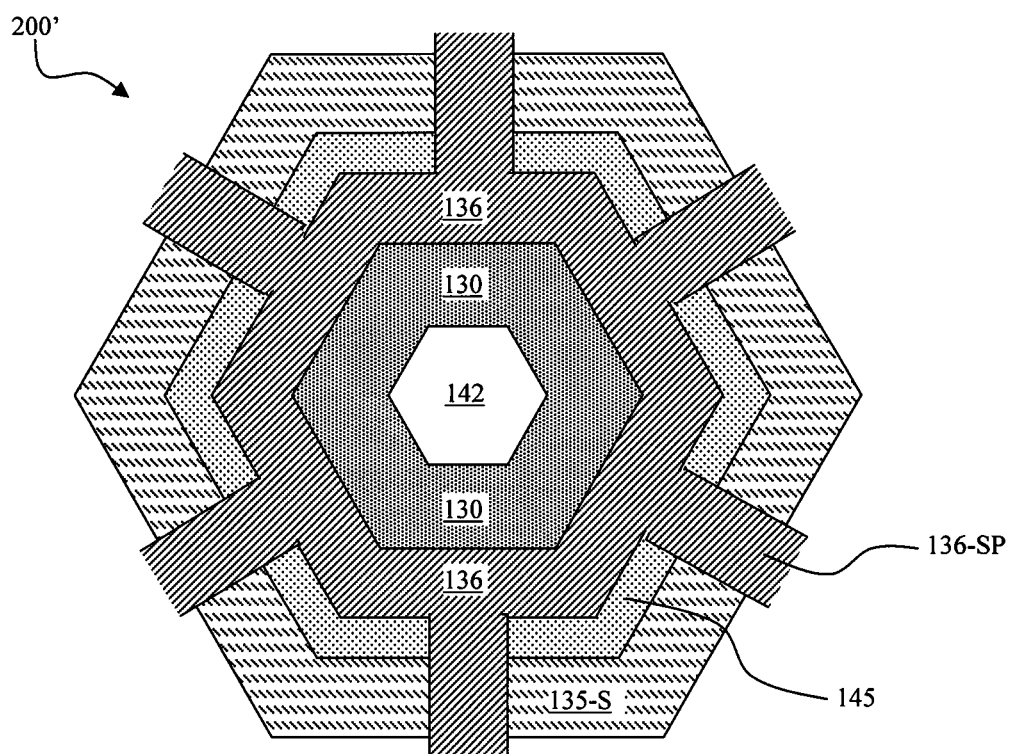
Fig. 10C Present Invention

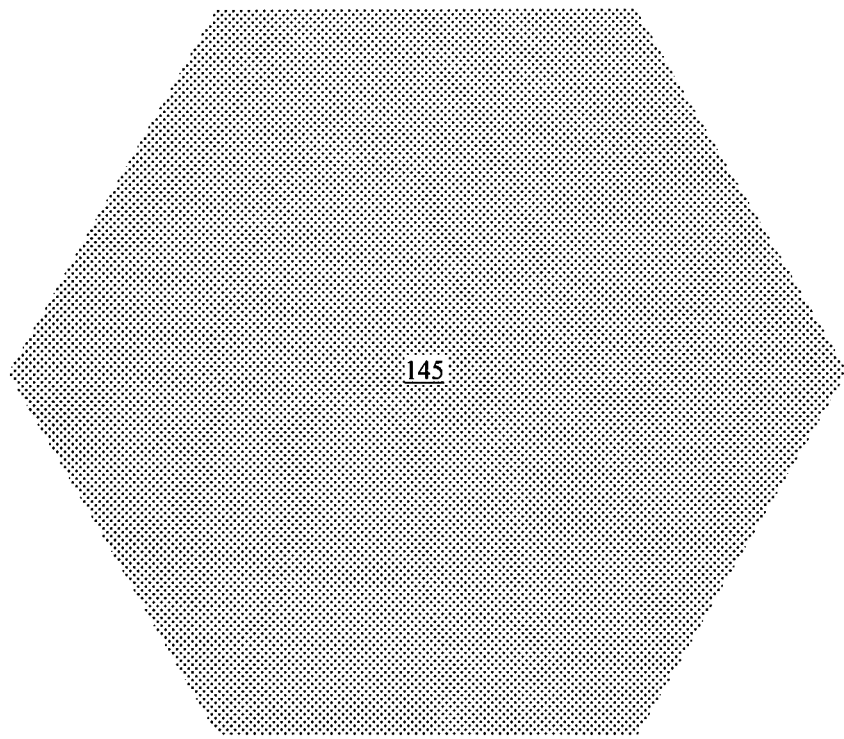
Fig. 11A Present Invention
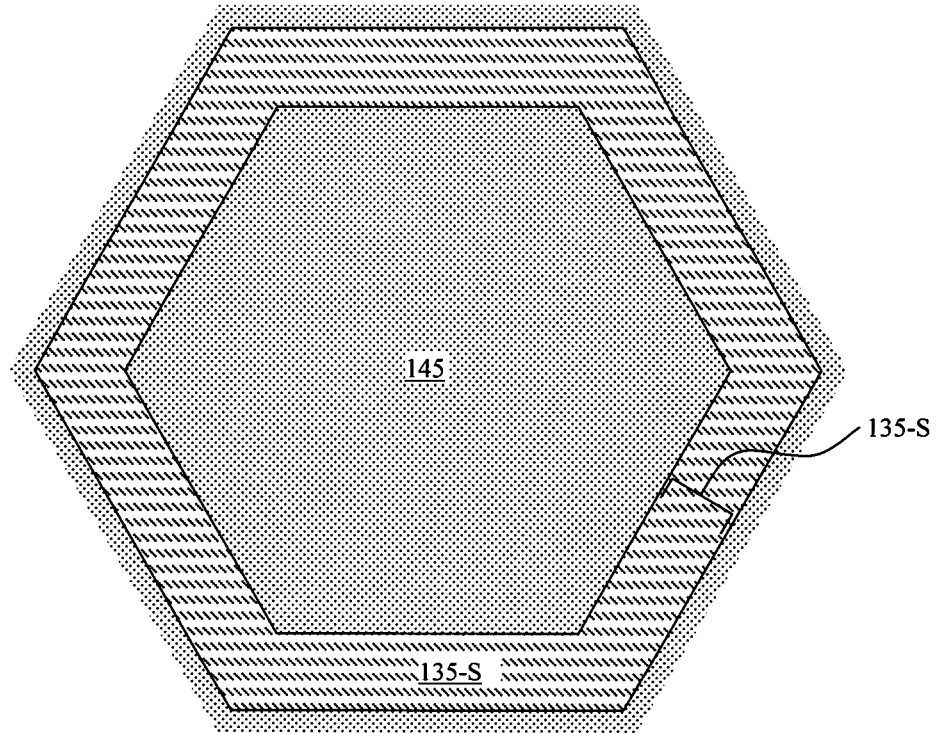
Fig. 11B Present Invention

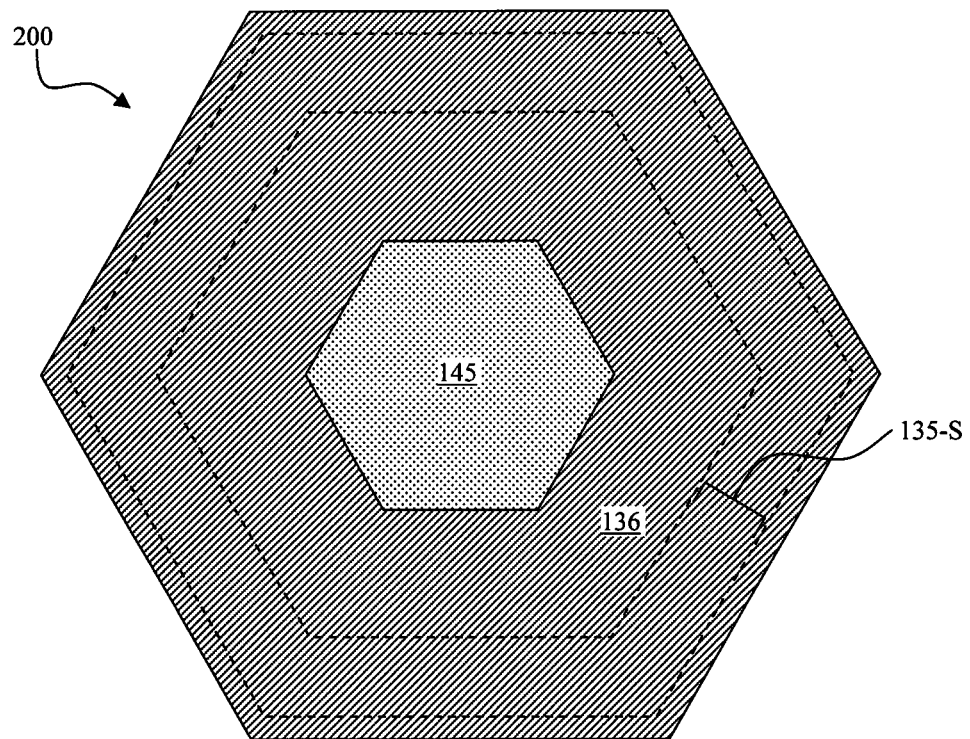
Fig. 11C Present Invention
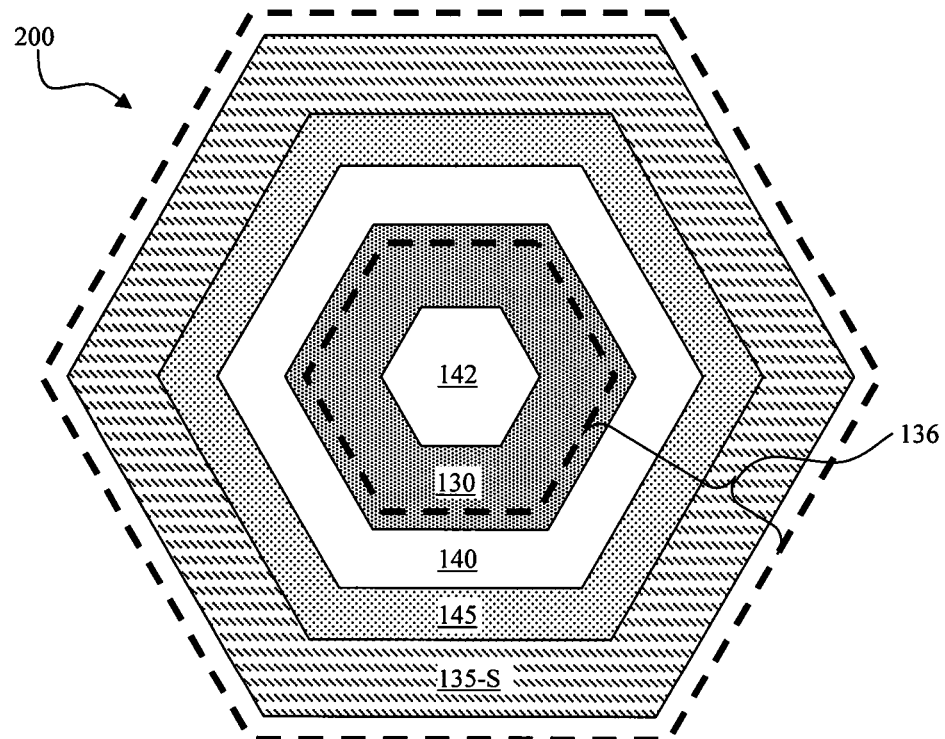
Fig. 11D Present Invention

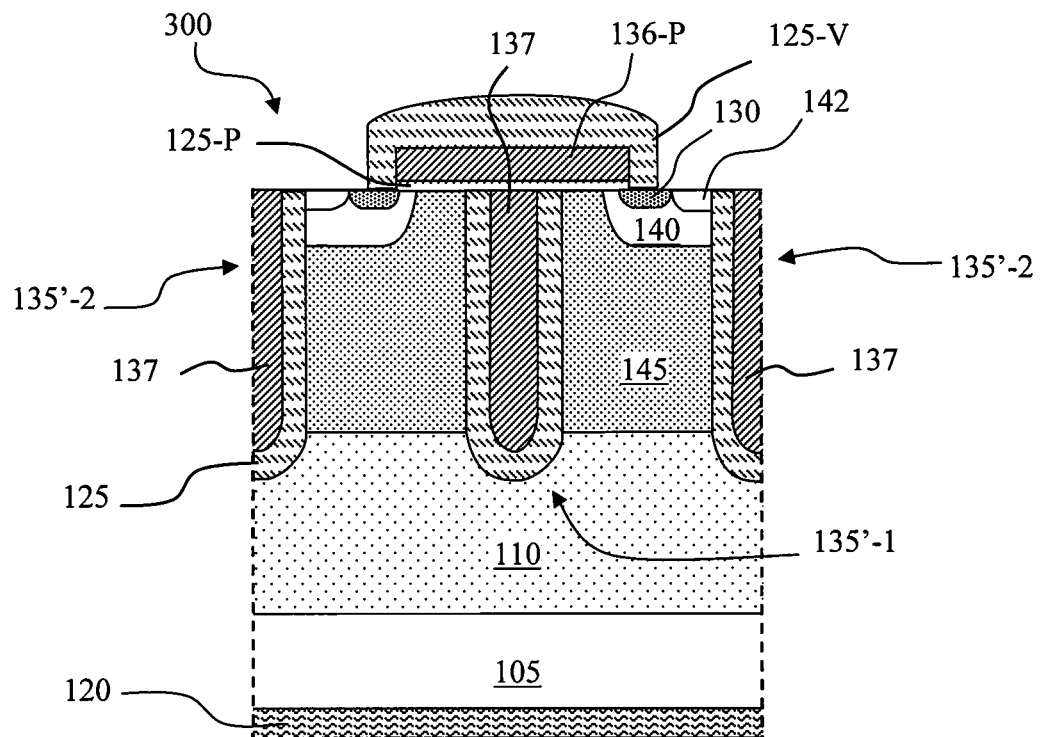
Fig. 12 Present Invention
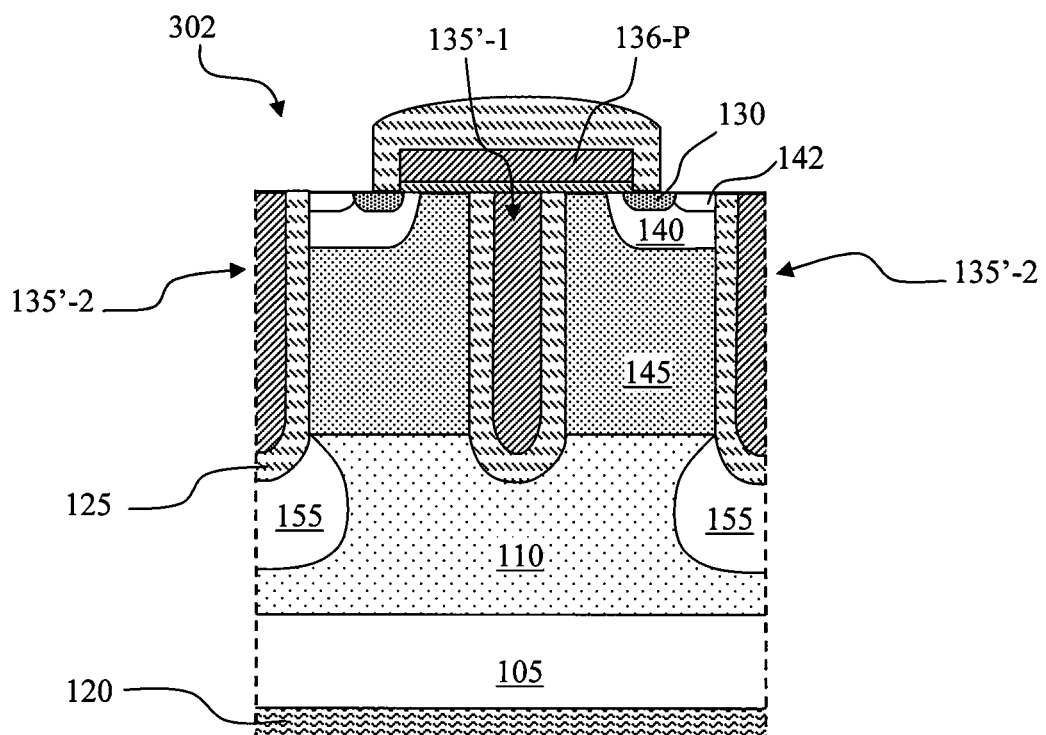
Fig. 13 Present Invention

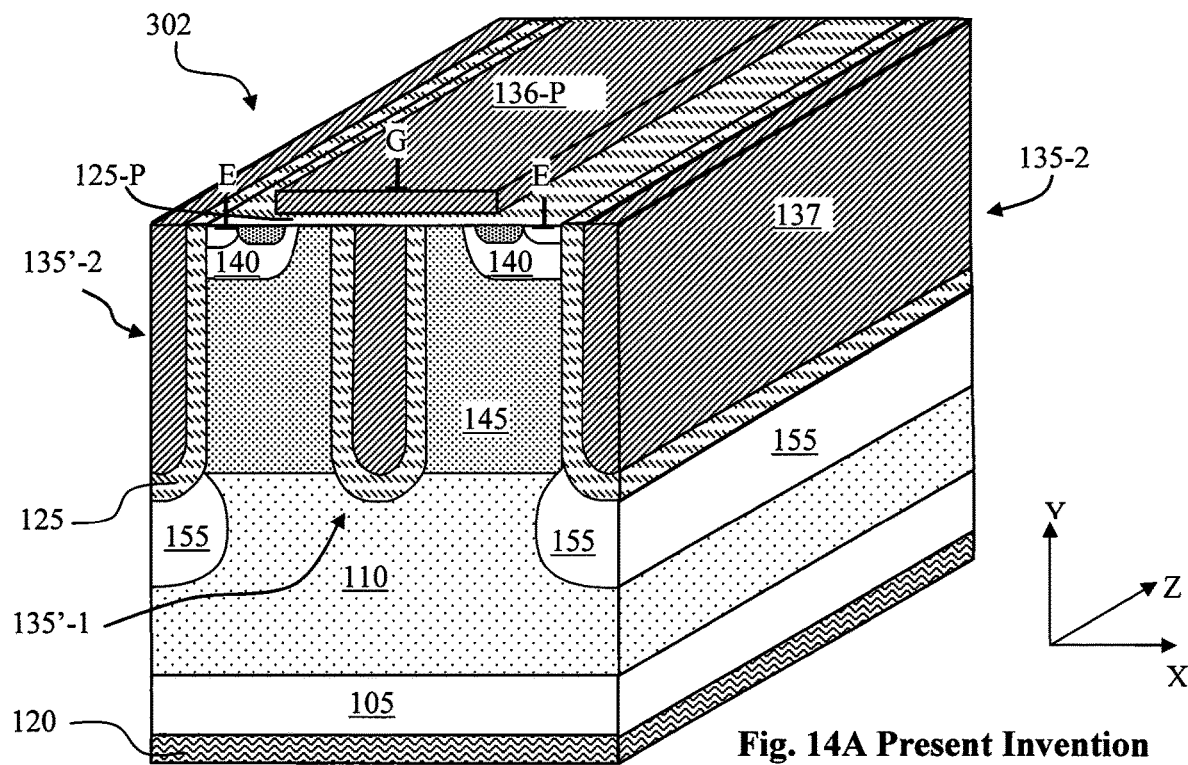
Fig. 14A Present Invention
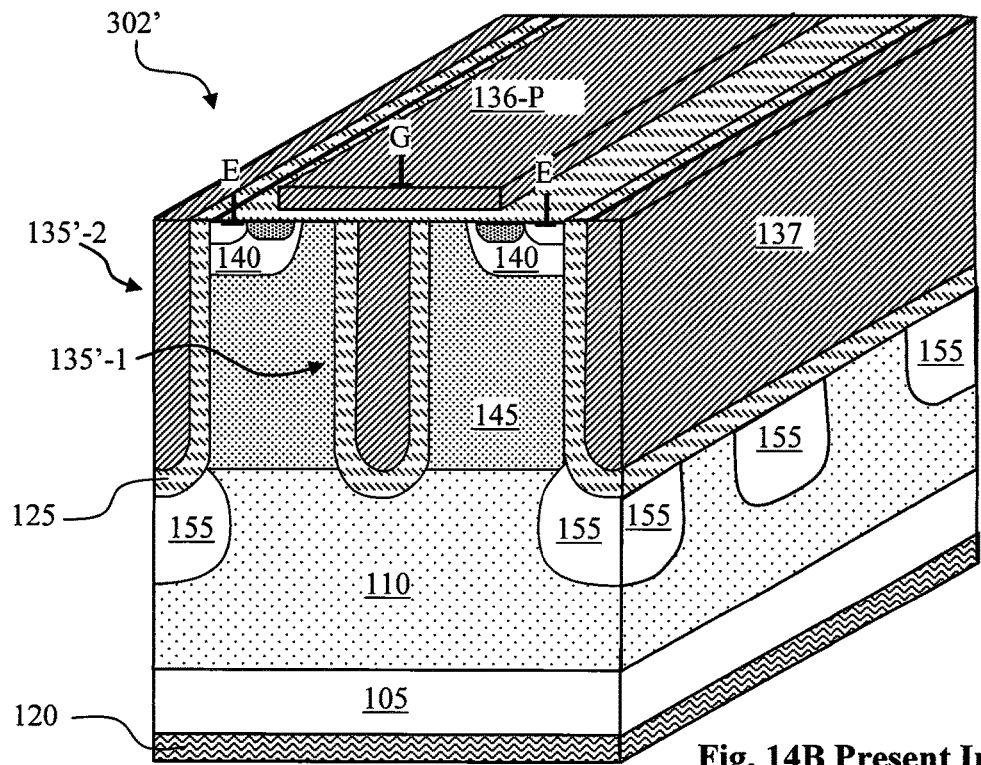
Fig. 14B Present Invention

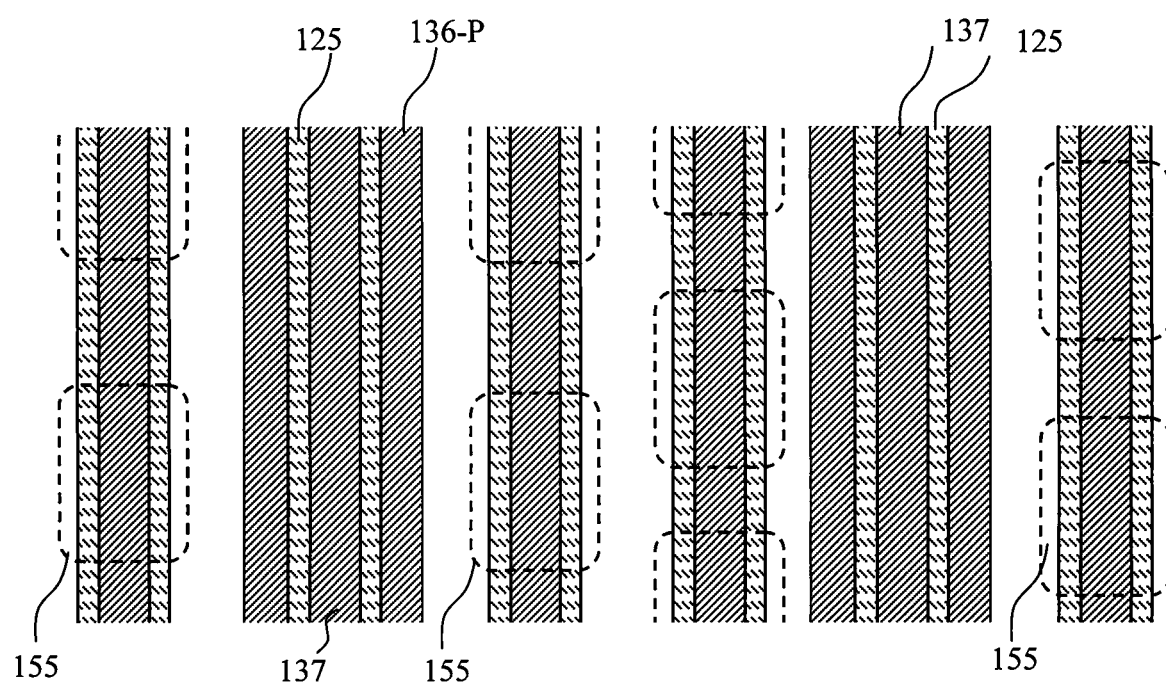
Fig. 14C Present Invention

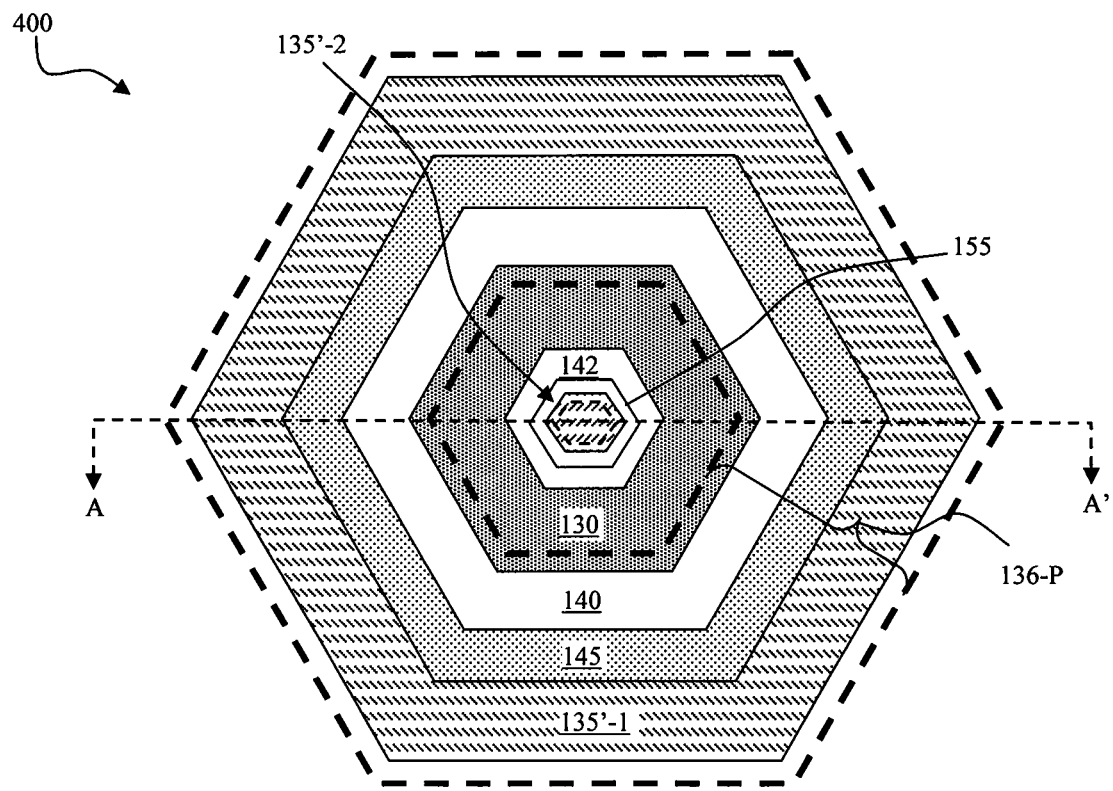
Fig. 14D Present Invention
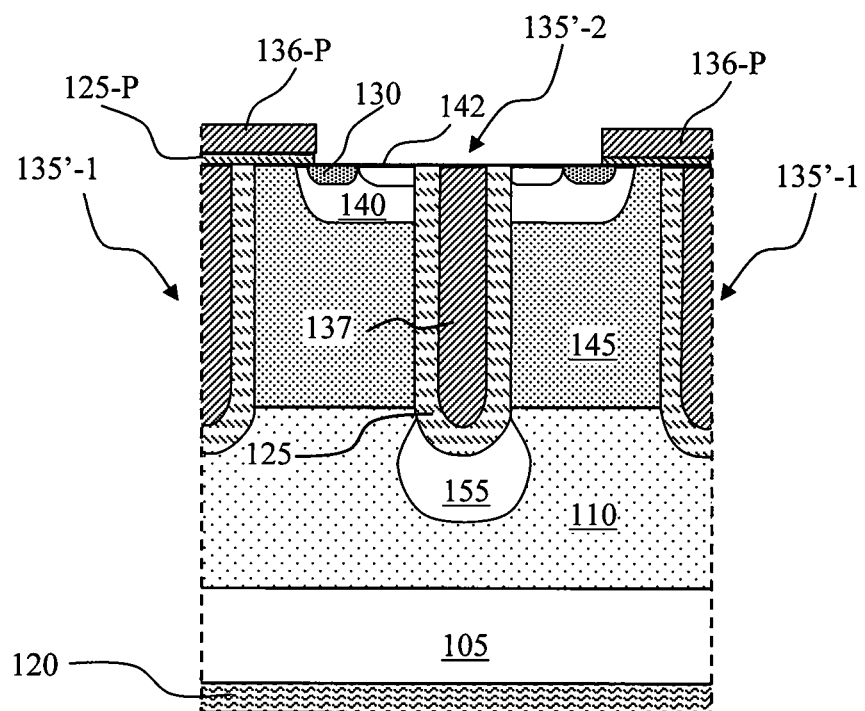
Fig. 14D-1 Present Invention – Along line A-A'

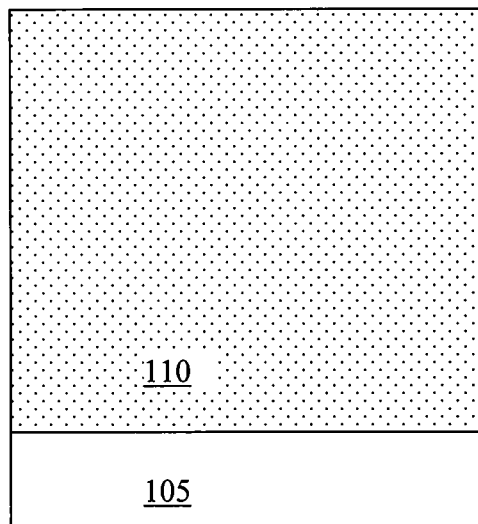
Fig.15A Present Invention
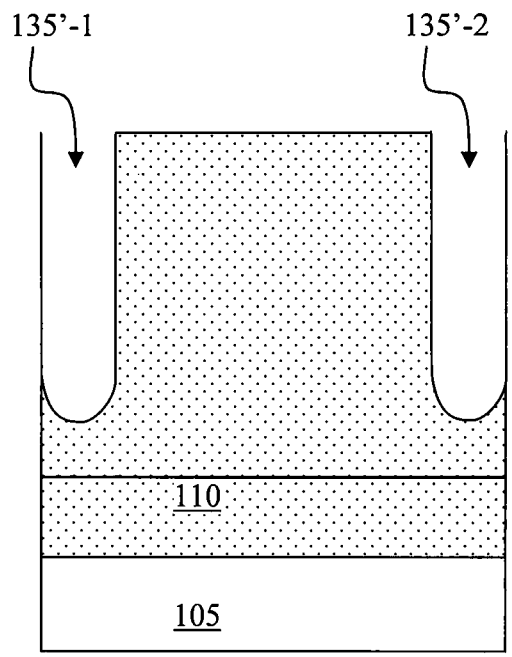
Fig. 15B Present Invention

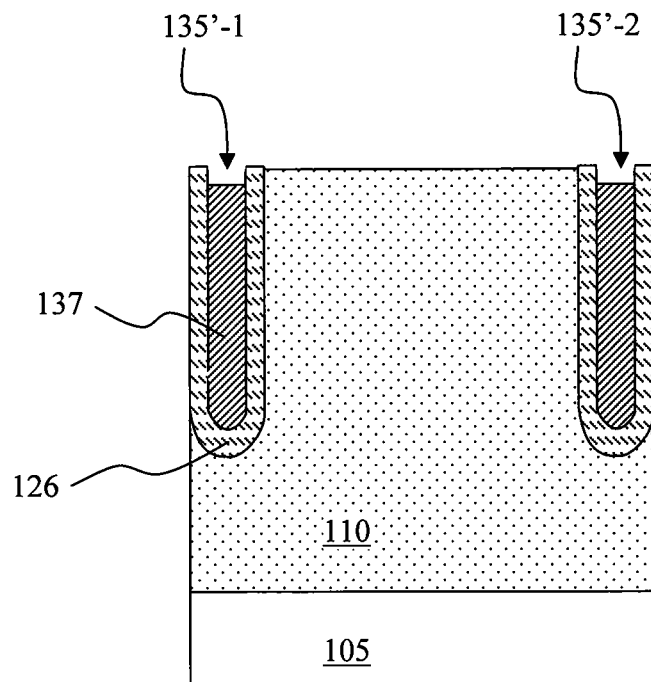
Fig. 15C Present Invention
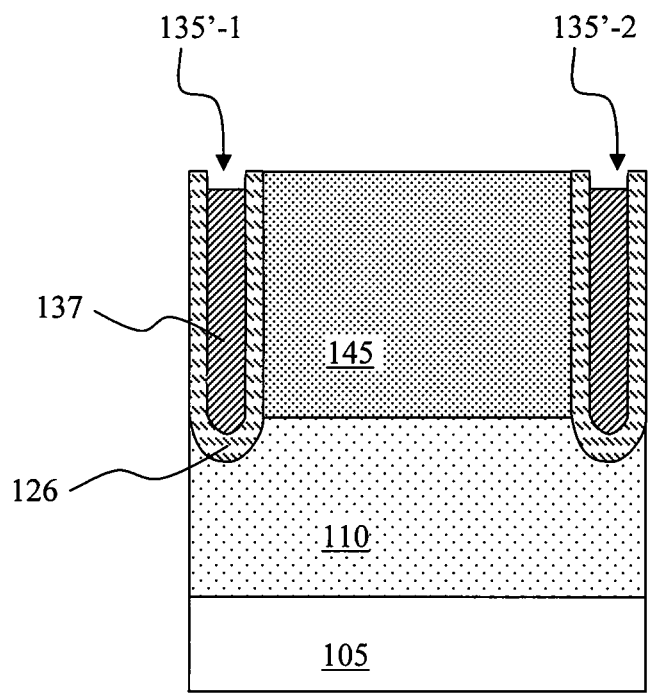
Fig. 15D Present Invention

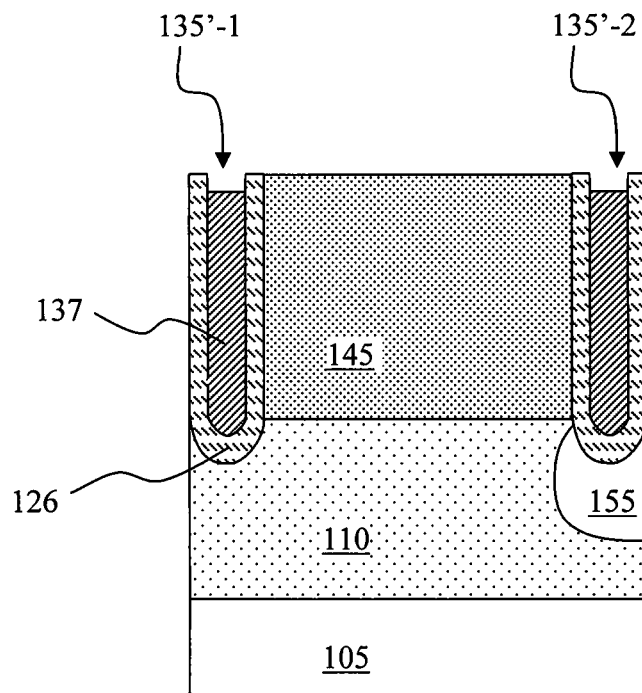
Fig. 15E Present Invention
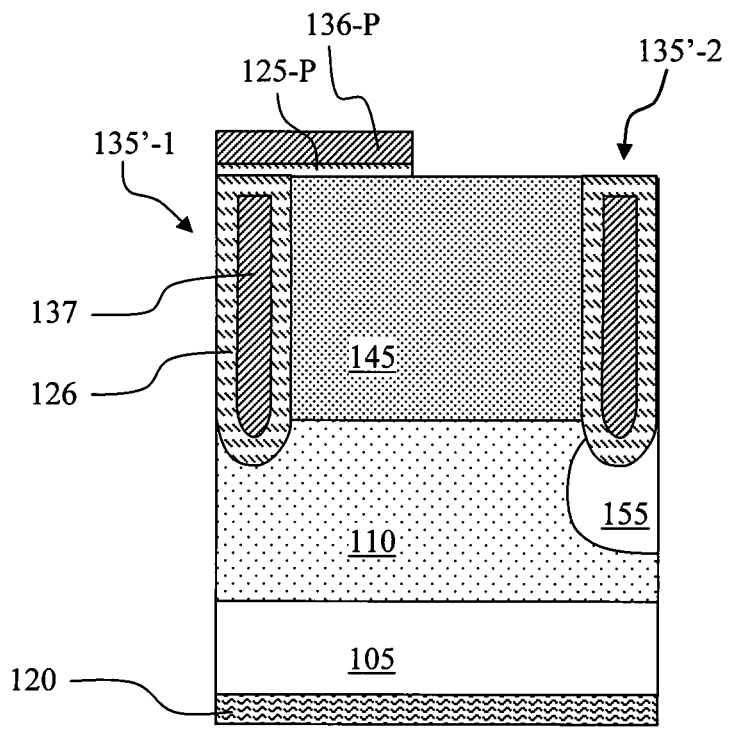
Fig. 15F Present Invention

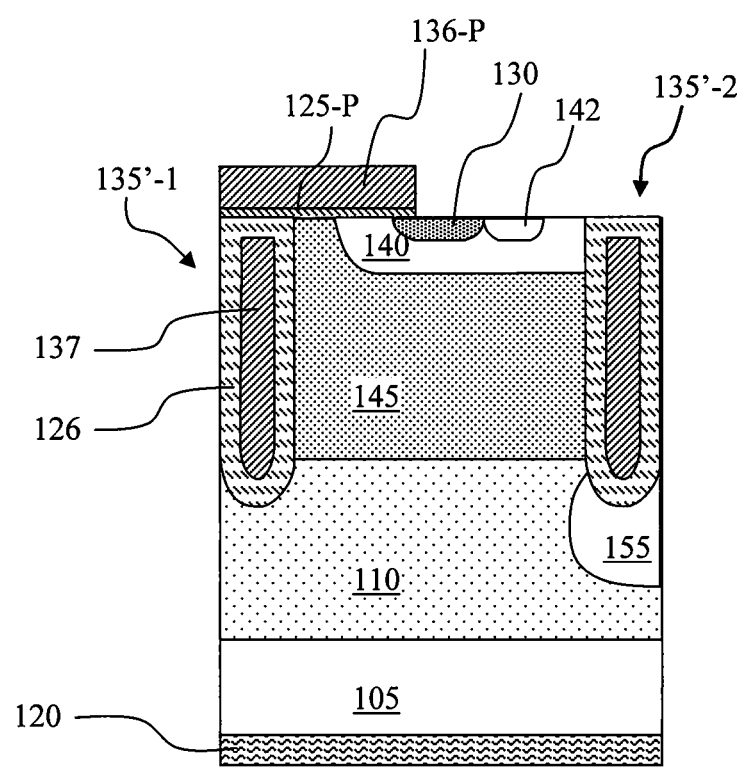
Fig. 15G Present Invention

DUAL-GATE TRENCH IGBT WITH BURIED FLOATING P-TYPE SHIELD

This Patent Application is a Divisional Application of a co-pending application Ser. No. 16/258,662 and application Ser. No. 16/258,662 is a Continuation Application of another application Ser. No. 15/600,782 now issued into U.S. Pat. No. 10,199,455 on Feb. 5, 2019. application Ser. No. 15/600,782 is a Divisional Application of another application Ser. No. 14/712,599 filed on May 14, 2015 now issued into U.S. Pat. No. 9,666,666 on May 30, 2017. Application Ser. No. 14/712,599 is a Divisional Application of application Ser. No. 13/831,066 filed on Mar. 13, 2013 and issued into U.S. Pat. No. 9,048,282 on Jun. 2, 2015. Application Ser. No. 13/831,066 is a Continuation in Part (CIP) Application and claim the Priority Date of a co-pending application Ser. No. 12/925,869 filed on Oct. 3, 2010 filed by a Common Inventor of this Application and issued into U.S. Pat. No. 8,933,506 on Jan. 13, 2015.

BACKGROUND OF THE INVENTION

1. Field of the Invention

The invention relates generally to semiconductor power devices. More particularly, this invention relates to new configurations and methods for manufacturing improved device structures for insulated gate bipolar transistors (IGBT) with dual gates to provide trench shield and further providing buried floating shield ring under the trench to improve the UIS ruggedness of the IGBT device.

2. Description of the Prior Art

Conventional technologies to configure and manufacture insulated gate bipolar transistor (IGBT) devices are still confronted with difficulties and limitations to further improve the performances due to different tradeoffs. In IGBT devices, there is a tradeoff between the conduction loss $V_{CI}$ sat (which depends upon the collector to emitter saturation voltage at rated current $V_{CE}$,sat) and turn-off switching losses, Eoff. More carrier injection while the device is on improves the conductivity of the device, thus reducing conduction loss, but more carrier injection would also cause higher Eoff, because of the energy dissipated when clearing out the injected carriers during turn-off. FIG. 1D is a graph showing the trade-off between $V_{CE}$,sat and Eoff. It can be observed that the curve for a superior IGBT structure will be shifted closer to the origin, corresponding to lower losses.

In addition a trade-off also exists between the IGBT $V_{CE}$,sat (conduction loss) and the IGBT's short circuit ruggedness, which in turn depends upon its saturation current Jsat. A high Jsat will result in a lot of energy dissipated in the device during short circuit, which would quickly damage the IGBT device. A lower Jsat will reduce the amount of energy dissipated, allowing the IGBT device to withstand the short circuit for a longer period of time without permanent damage; however, a lower Jsat also results in higher conductivity loss $V_{CE}$,sat.

FIG. 1A shows the cross section of a conventional planar gate insulated gate bipolar transistor (IGBT). The IGBT is a semiconductor power device that combines a metal oxide-semiconductor (MOS) gate control with a bipolar current flow mechanism. The functional features of both a metal-oxide-semiconductor field effect transistor (MOSFET) and a bipolar junction transistor (BJT) are combined in an IGBT. Performance features of IGBT are designed to achieve a higher current density than the MOSFETs and faster and more efficient switching characteristics and better control than the BJTs. The drift region can be lightly doped for improved blocking abilities. However the device can still have good conductivity because the lightly doped drift region undergoes high level carrier injection from the bottom P collector region resulting in its conductivity modulation. For these reasons, IGBT devices are often implemented for high power (>10 kW), low to medium frequency (up to 30 kHz) applications. The planar IGBT device shown in FIG. 1A has a simple top side structure and is easy to fabricate. However, the planar gate IGBT as shown in FIG. 1A has high $V_{CE}$,sat due to poor conductivity mod, elation near the top side and in addition high JFET resistance due to pinching from neighboring body regions. FIG. 1B is a cross sectional view of another conventional IGBT device that has a trench gate. The trench gate IGBT has the advantages of eliminating the JFET resistance and also has an enhanced top side carrier injection. An accumulation layer can form under the trench gate to improve carrier injection. However, the trench IGBT device as shown has a high Crss capacitance due to capacitance between the trench gate (at gate voltage) and the substrate and drift region below (at drain voltage). The high Crss of this IGBT device slows down the device switching speed and also leads to higher switching energy losses. FIG. 1C is a cross sectional view of another conventional IGBT device. There is a more heavily doped N layer disposed below the channel region, at the top of the lightly doped drift region to further enhance the carrier injection on the topside. However, such device has a lower breakdown voltage due to the heavily doped layer and has a further worsened Crss due to the heavily doped N-layer.

For the above reasons, there is a need to provide a new IGBT configuration to reduce the turn-on and turn off energy Eon losses and Eoff losses for improvement of the operation efficiency. Furthermore, it is desirable the new IGBT with the improved configuration can reduce the Crss,increase the breakdown voltage, improve $V_{CE}$,sat and to increase the cell pitch to lower the Jsat such that the above discussed limitations and difficulties can be resolved.

SUMMARY OF THE PRESENT INVENTION

It is therefore an aspect of the present invention to provide a new and improved IGBT device configuration and manufacturing method for providing a trench IGBT device with a dual trench gate configuration and further provided with buried floating P-type shield under the trench such that the UIS ruggedness is improved without sacrificing Vcesat, BV and Eoff.

It is another aspect of this invention to provide a new and improved IGBT device with shielded gate IGBT with more heavily doped layer N layer such that the IGBT can achieve increased injection with lower E-on and E-off losses.

Specifically, it is an aspect of the present invention to provide a new and improved device configuration and manufacturing method for providing a trench IGBT device with a shielded gate with optional dummy trench such that the IGBT with the shield gate can achieve a reduced Crss and lowering the E-on losses and further can taking advantage of a Re-surf action of such IGBT device to increase the breakdown voltage.

Another aspect of the present invention is to provide a new and improved device configuration and manufacturing method for providing an IGBT device with a shielded gate with dummy trench such that the cell pitch can be increased to achieve a lower J-sat.

It is another aspect of the present invention to provide a new and improved device configuration and manufacturing method for providing shielded-gate trench IGBT with a two-dimensional channel for achieving a longer channel without a deep body region or an excessively deep trench. The two dimensional channel includes a lateral (planar gate) and a vertical (trench gate) component thus achieving relatively high channel resistance to lower Jsat. The device can therefore achieve an improved rugged short circuit performance with a small cell pitch.

Briefly in a preferred embodiment this invention discloses a method of manufacturing an insulated gate bipolar transistor (IGBT) device comprising 1) preparing a semiconductor substrate with an epitaxial layer of a first conductivity type supported on the semiconductor substrate of a second conductivity type; 2) applying a gate trench mask to open a first trench and second trench followed by forming a gate insulation layer to pad the trench and filling the trench with a polysilicon layer to form the first trench gate and the second trench gate; 3) implanting dopants of the first conductivity type to form an upper heavily doped region in the epitaxial layer; and 4) forming a planar gate on top of the first trench gate and apply implanting masks to implant body dopants and source dopants to form a body region and a source region near a top surface of the semiconductor substrate.

In another preferred embodiment, the IGBT device includes an insulated gate bipolar transistor (IGBT) device. The IGBT device is supported on a semiconductor substrate comprising an epitaxial layer of a first conductivity type supported on a bottom layer of a second conductivity type electrically contacting a collector electrode disposed on a bottom surface of the semiconductor substrate. A body region of the second conductivity type disposed near a top surface of the semiconductor substrate encompassing a source region of the first conductivity type below a top surface of the semiconductor substrata The epitaxial layer further includes an upper heavily doped layer having a higher dopant concentration of the first conductivity type below the body region. A first trench gate and a second trench gate disposed on two opposite sides of the body region and a planar gate disposed on the top surface of the semiconductor substrate extending laterally over the first trench gate to the body region.

In an alternative embodiment, lightly doped source (LDS) regions may be placed between the gate and more heavily doped source regions to increase the resistance and improve the short circuit ruggedness of the device Furthermore, this invention discloses a method of manufacturing a semiconductor power device in a semiconductor substrate. The method may include a step of forming a dummy trench for an IGBT in a semiconductor substrate for increasing a cell pitch for lowering a J-sat of the IGBT. In another embodiment, the method further may include a step of forming the IGBT with a two-dimensional channel by forming a trench gate of the IGBT to extend laterally above a body region to a source region such that the channel includes a lateral and a vertical component. An IGBT may also be formed by forming shield trenches with shield electrodes near the top of the device and forming planar gates on the top surface of the device.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIG. 1D is a chart showing tradeoffs in the characteristics of IGBT devices.

FIG. 2 is a cross sectional view of a shielded gate IGBT with trench gate and trench shield.

FIG. 3A is a cross sectional view of a shielded gate IGBT device having a trench shield and a 2D trench gate with a lateral extension to control a two-dimensional (2D) channel with a lateral and vertical channel components of this of this invention. FIG. 3B is a similar structure with lightly doped source (LDS) added.

FIG. 4 is a cross sectional view of a shielded gate IGBT device having a trench shield and a planar gate that is parallel to the trench shield.

FIG. 5 is a similar cross sectional view of a shielded gate IGBT device having a trench shield and a planar gate that is parallel to the trench shield. FIG. 5-1 is a similar cross sectional view to FIG. 5, except that it includes a field stop layer near the bottom of the device.

FIG. 6 is a cross sectional perspective view of a shielded gate IGBT device having a trench shield and a planar gate that is perpendicular to the trench shield, in the $3^{rd}$ dimension.

FIGS. 7A-7C, and 7E are possible top views of FIG. 6.

FIG. 7D is an alternative cross sectional perspective view similar to FIG. 6.

FIGS. 8A-8J are cross sectional views illustrating a process of forming a device of this invention.

FIGS. 9A-9D are cross sectional views illustrating a process of forming another device of this invention.

FIGS. 10A-10C are top views showing an IGBT closed cell layout of this invention.

FIGS. 11A-11D are top views illustrating a method of making an IGBT with a closed cell layout of this invention.

FIG. 12 is a cross sectional view of another IGBT comprises dual gate trench with the trench poly under the planar gate connected to gate electrode for improving VCESAT, reducing gate ringing and turn off voltage overshooting according to a preferred embodiment of this invention.

FIG. 13 is a cross sectional view of the IGBT of the type shown in FIG. 12 with floating buried P-type shield according to another preferred embodiment of this invention.

FIG. 14A is a cross sectional perspective view of the IGBT shown in FIG. 13.

FIG. 14B is a cross sectional perspective view of an alternative IGBT of the type shown in FIG. 14.

FIG. 14C is a top view showing two patterns of the islands to form the floating buried P-type rings.

FIG. 14D is a top view showing the close-cell IGBT structure with floating buried P-type rings.

FIG. 14D-1 is a cross sectional view along line A-A' of FIG. 14D.

FIGS. 15A-15G are cross sectional views illustrating a process of forming a device of the type depicted in FIG. 13.

DETAILED DESCRIPTION OF THE METHOD

Figure 1A:
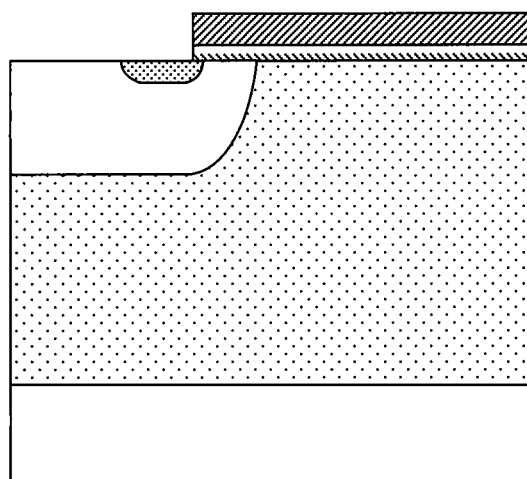
FIGS. 1A to 1C are cross sectional views showing three different configurations of conventional IGBT devices.

FIG. 2 is a cross-sectional view of an IGBT device having a trench shield and trench gate configuration with dummy trench of this invention. The IGBT device 100 is formed in semiconductor substrate 105 that has a first conductivity type, e.g., a P type substrate 105. An epitaxial layer 110 of a second conductivity type, e.g. an N– epitaxial (epi) layer 110, is supported on top of the P-type substrate 105. Alternatively, the P type substrate 105 and the epitaxial layer 110 may together be referred to as the semiconductor substrate since they both generally have a mono-crystalline structure; additionally, the P type substrate 105 may be more generally referred to as a bottom or lower semiconductor layer and the epitaxial layer 110 may more generally be referred to as an upper semiconductor layer. The IGBT 100 is a vertical IGBT device with a collector electrode 120 disposed on a bottom surface of the substrate and an emitter electrode 131 disposed on a top surface. The IGBT device shown in FIG. 2 has a shield gate trench 135 extending into the epitaxial layer that comprises an insulation layer padded trench filled with an upper gate segment 135-1 and a lower shield segment 135-2 insulated from each other by an inter-segment insulation layer 138. The upper gate segment 135-1 is lined with a gate oxide 125. The lower gate segment 135-2 is lined with an oxide layer 126. The IGBT device further includes a dummy trench 135-DM filled with a dielectric layer, and optionally a polysilicon layer 135-DM-poly, disposed at a distance away from the shield gate trench 135. The IGBT device further includes a P-type body/emitter region 140 extended between the shield gate trench 135 and the dummy trench 135-DM encompassing an N-type source region 130 next to the shield gate trench 135 near a top surface of the semiconductor substrate. The body/emitter region 140 extended between the shield gate trench 135 and the dummy trench 135-DM further extends vertically from a top surface of the epitaxial layer 110 to a depth approximately the same as the depth of the bottom of upper gate segment 135-1 in the semiconductor substrate. Preferably the upper gate segment 135-1 extends slightly deeper than body/emitter region 140. The IGBT device further includes a heavily doped N region 145 as an N-type region disposed below the body/emitter region 140 and above a bottom portion of the N-type epitaxial layer 110. The remaining N-type epi layer 110 functions as a drift region above a bottom P-type collector region 105 at a bottom surface of the semiconductor substrate. The heavily doped N region 145 disposed below the body/emitter region 140 further extends vertically from a bottom of the body/emitter region 140 to an approximately depth the same as the lower shield segment 135-2. The heavily doped N region 145 has the same conductivity type as the drift region/epitaxial layer 110, but heavily doped N region 145 has a higher doping concentration. Together, the heavily doped N region 145 and N drift/epitaxial region 110 may act as the base of the PNP bipolar transistor portion of the IGBT device. The lower shield segment 135-2 is padded by a thick trench insulation layer 126 over a bottom surface of the shield gate trench 135.

The IGBT device 100 has an advantage that the shield gate trench and heavily doped N region can achieve improved conduction with lower Eoff and Eon losses. The presence of heavily doped N region increases arrier concentration near the topside region of this device, thereby lowering Vce,sat without increasing carrier injection level and Eoff. The heavily doped N region improves the conductivity modulation of the device by making the carrier profile more uniform during conductivity modulation by putting the heavily doped N region having many majority carriers at the top of the drift/epitaxial region, where the minority carrier concentration usually drops off. Furthermore, the shield electrode of this embodiment can achieve a reduced Crss and lower the Eon and Eoff losses and further can take advantage of a Re-surf action of such IGBT device to prevent any lowering of breakdown voltage due to the presence of heavily doped N region under the P body. The shield electrode also allows the heavily doped N region to be even more highly doped and thus improves the Vce,sat. The dummy trench may be an optional feature, but can be included to increase the cell pitch, which achieves a lower Jsat, and thus improve the short circuit ruggedness of the device. The trench 135-DM can be made a dummy trench by removing the MOS channel action from it, for example by connecting the dummy trench poly 135-DM-poly to the source voltage, or by not placing a source region 130 adjacent to the dummy trench 135-DM.

FIG. 3A is a cross-sectional view of another IGBT device, having a shielded gate trench bipolar transistor configuration with a two-dimensional (2D) channel of this invention. The IGBT device 100' is formed in semiconductor substrate 105 that has a first conductivity type, e.g., a P type substrate 105. An epitaxial layer 110 of a second conductivity type, e.g., an N-epitaxial layer 110, is supported on top of the P-type substrate 105. The IGBT 100' is a vertical IGBT device with a collector electrode 120 disposed on a bottom surface of the substrate and an emitter electrode 131 disposed on a top surface. The IGBT device has a shield gate trench 135' that comprises a trench padded with insulation layer and filled with an upper gate segment 135-1-V and a lower shield segment 135-2 separated by an inter-segment insulation layer 138. The IGBT device 100' may further include a dummy trench 135-DM optionally having an electrode, e.g., a polysilicon layer 135-DM-poly, disposed at a distance away from the shield gate trench 135. The IGBT device further includes a body/emitter region 140 extended between the shield gate trench 135' and the dummy trench 135-DM encompassing a source region 130' disposed between the shield gate trench 135' and the dummy trench 135-DM near a top surface of the semiconductor substrate. The body/emitter region 140 extended between the shield gate trench 135' and the dummy trench 135-DM further extends vertically to a depth shallower than a depth of the upper gate segment 135-1-V in the semiconductor substrate. The emitter electrode 131 is connected to the source 130' and the body/emitter region 140 (and to the dummy trench electrode 135-DM-poly). The upper gate segment 135-1-V further extends on its top side to planar gate segment 135-1-P over a top surface of the semiconductor substrate above the body/emitter region 140 and reaching the source region 130'. The upper gate segment 135-1-V is insulated from the semiconductor substrate by vertical gate oxide 125-V. The planar gate oxide 125-P insulates the planar gate segment 135-1-P from the semiconductor surface. The IGBT device 100' further includes a heavily doped region 145 as an N-type region disposed below the body/emitter region 140 and above a bottom portion of the N-type epitaxial layer 110. The N-type epitaxial layer 110 functions as a source-dopant-type drift region above a bottom body-dopant-type collector region 105 at a bottom surface of the semiconductor substrate. The heavily doped N+ region 145 disposed below the body-dopant region 140 further extends vertically to a depth approximately the same as the lower shield segment 135-2. The heavily doped N+ region 145 and the N-epi layer 110 under the body region 140 may be considered the drain of the MOSFET portion of the insulated gate bipolar transistor (IGBT), and also as the base region of the bipolar junction transistor (BJT) portion of the IGBT. The lower shield segment 135-2 is padded by a thick gate insulation layer 126 over a bottom surface of the shield gate trench 135'. The lower shield segment 135-2 is connected to the source/emitter voltage.

The IGBT device 100' shown in FIG. 3A is implemented with a new and improved device configuration and manufacturing method to provide a shielded-gate trench bipolar transistor with two-dimensional channel for achieving a longer channel without requiring a deep body region. The two dimensional channel includes a lateral and a vertical component thus achieving relatively high channel resistance by increasing the channel length without requiring excessively deep trenches, which are difficult and expensive to fabricate, or requiring excessively wide cell pitches. The high channel resistance is desirable to reduce the saturation current density, Jsat. The device can therefore achieve an improved rugged short circuit performance, while having a small cell pitch.

FIG. 3B shows another embodiment of the present invention with IGBT 100" similar to the IGBT 100' of FIG. 3A except that the IGBT 100" additionally includes an N-type lightly doped source (LDS) region 133 located between the highly doped N-type source region 130, and the beginning of the planar gate portion 135-1-P. The lightly doped source region 133 provides addition. 1 series resistance which adds a voltage drop during current flow, leading to emitter de-biasing. This voltage drop is small and negligible at normal operating currents, but during high currents, such as those produced during a short circuit, the voltage drop is high, which significantly reduces the saturation current density, Jsat, and improves the device's ability to withstand a short circuit. This also allows for a smaller cell pitch design while keeping the saturation current density Jsat low.

FIG. 4 shows another embodiment of the invention in which the gate of IGBT 101 is a planar gate 136. The trenches only have a shield electrode 137 surrounded by dielectric (e.g. oxide) 126 to form shield trenches 135-S; the shield trenches 135-S do not have a gate electrode component. The device does not require a trench gate electrode. The shield electrode 137 is connected to the source/emitter voltage. In this embodiment, the channel is only horizontal, running at the top of the body region 140, beneath the planar gate 136, from the source 130 (and optional lightly doped source 133) to the top of the heavily doped N+ region 145. This embodiment may be easier to manufacture, as it is simple to form a planar gate and because the shield trench 135-S with its single electrode is much easier to form than a shield gate trench structure with multiple electrodes. The shield trench 135-S still charge compensates the N+ region 145 to keep the breakdown voltage (BV) high, and also keeps the capacitance Crss low for fast and efficient switching.

FIG. 5 shows a slight variation of the IGBT 101 of FIG. 4, except that the IGBT 101' does not include the lightly doped source 133, but only has N+ source region 130. It also further includes a highly doped P+ body contact region 142, to allow good contact to the P-body region 140. The emitter electrode is not specifically shown but it contacts the source 130 and the P+ body contact regions 142, and is also connected to shield trench electrodes 137.

The embodiments of this invention may also be combined with various bottom structures. For example in FIG. 5-1, IGBT 101'-1 is similar to IGBT 101' of FIG. 5, except for the inclusion of an N-type field stop layer 111 at the bottom of the N-epi drift layer 110.

FIG. 6 shows a cross sectional perspective view of an IGBT device 102 similar to the IGBT device 101' of FIG. 5. In IGBT 102, the planar gate 136 runs in a different direction than the shield trenches 135-S. They both parallel to the major plane of the device, e.g. along the top surface of the semiconductor material substrate (highly doped bottom substrate and epi layer together), but in different directions along the surface. For example, as shown in FIG. 6, the planar gate 136 runs substantially perpendicularly to shield trenches 135-S; the planar gate 136 runs in the X-axis direction, while the shield trench 135-S runs in the Z-axis direction.

FIG. 7A shows a possible top view of the IGBT 102 of FIG. 6. This shows the top view along the X-Z plane, with planar gate 136, source 130, body 140, and body contact regions 142, running in stripes in the X-axis direction. The shield trench 135-S runs in the Z-axis direction. The shield electrode 137 is covered by trench oxide 126, but its outline is indicated by dashed lines. Again, the emitter electrode and top passivation layers are not shown for clarity.

FIG. 7B shows another top view similar to that of FIG. 6, except that in this case, the planar gate 136 and its underlying gate oxide 125 are made transparent to show the underlying structures; also, the shield electrode 137 is shaded in this figure, even though it is actually covered by the trench oxide 126. A portion of the body region 140 lies between the source region 130 and the top of the N+ region 145, and it is within this portion that the MOS channel is formed. However a potential problem can occur in the channel region 177 adjacent to the shield trench 135-S. In region 177, an inversion layer may form in the P-body 140 adjacent to the shield trench 135-S under a small gate bias. This lowers the threshold voltage Vt of the device and can also lead to increased leakage in the device.

To solve this problem, it is desired to suppress the transistor action adjacent to the shield trench 135-S. FIG. 7C is a top view showing one possible way to suppress the transistor action adjacent to the shield trench 135-S. The IGBT 102' of FIG. 7C is similar to IGBT 102 of FIG. 7B, except that the source region 130' is pulled away from the shield trench 135-S in the X-axis direction, thus pulling transistor action away from the shield trench 135-S, and preserving the threshold voltage Vt.

FIG. 7D is a perspective view showing another way to suppress the transistor action adjacent to shield trench 135-S. The IGBT 102" of FIG. 7D is similar to IGBT 102 of FIG. 6 except that the top of the shield electrode 137' is recessed, so that the top of the shield electrode 137' will not be near the channel region 177 of FIG. 7B. This should prevent the shield electrode from interfering with the threshold voltage in the channel regions adjacent to the shield trench 135-S.

Yet another way to suppress the transistor action is to switch the conductivity type of the shield electrode 137. In a typical n-channel IGBT device, the shield electrode is made of n-type polysilicon. However, to increase the threshold voltage in the channel regions adjacent to the shield trench, the shield electrode can be made of p-type polysilicon. This should keep the threshold voltage in the channel regions adjacent to the shield trench 135-S from dropping.

FIG. 7E shows another alternative embodiment of the invention very similar to IGBT 102' of FIG. 7C, except that IGBT device 102''' of FIG. 7E further includes a lightly doped source 133 similar to that shown in FIG. 5A. Of course, other layouts are possible, such as a closed cell layout.

Figure 1B:
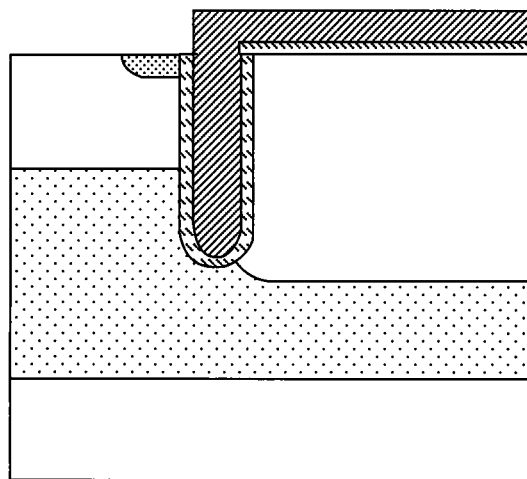
Figure 1C:
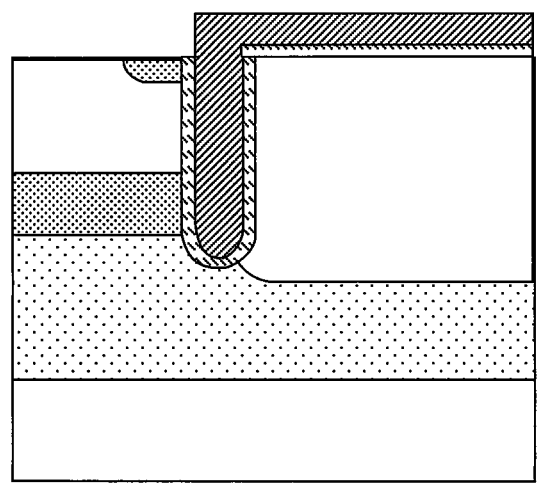

By way of example, FIGS. 8A-8J show a simple method to form the IGBT device of this invention. FIG. 8A shows a starting semiconductor substrate including a (P-type) bottom semiconductor layer 105 with an (N-type) semiconductor top layer 110 of opposite conductive type located thereon. In FIG. 8B, trenches 135 are etched into the top semiconductor layer 110. In FIG. 8C, the trenches are lined with a dielectric (e.g. oxide) 126 and a bottom shield electrode 135-2 is formed at a bottom portion of the trench. In FIG. 8D, an inter-segment dielectric 138 is formed over the bottom shield electrode 135-2. In FIG. 8E, a gate dielectric (e.g. oxide) 125 is formed on the upper sidewalls of the trenches, and in FIG. 8F, a gate electrode (e.g. polysilicon) material 139 is filled into the trenches. In FIG. 8G, the gate electrode material 139 is etched back to form upper gate electrode 135-1, and optional dummy trench electrode 135-DM-poly. In an alternative embodiment, as shown in FIG. 8G-1, the gate electrode material 139 may be patterned to form vertical gate portion 135-1-V, and planar gate portion 135-1-P over the top surface. In FIG. 8H, a heavily doped layer having the same conductivity type as but higher doping concentration than the upper semiconductor layer 110 is formed near the bottom of the trenches. Of course, the heavily doped (N-type) layer may also be formed earlier in the process, before depositing the gate electrode material 139. In FIG. 8I, the source and body regions are formed (e.g. by implantation) along the top portion of the semiconductor layer 110. In FIG. 8J, an emitter electrode 131 is formed on the top surface, contacting the source region 130, and body region 140 and shield electrode 135-2 (connection not shown), and a collector electrode 120 is formed on the back surface contacting the bottom semiconductor layer 105.

FIGS. 9A-9D show another method of forming an IGBT device of this invention. In FIG. 9A, which is similar to FIG. 8C, except that instead of bottom shield electrodes 135-2 being formed at the bottom portion of the trench, shield electrodes 137 are formed filling most of the shield trenches 135-S. In FIG. 9B, a heavily doped layer 145 is formed in the upper portion of the layer 110 extending to the bottom of the shield trenches 135-S. Optionally, the heavily doped layer 145 could also be formed earlier in the process. In FIG. 9C, a gate dielectric 125-P is formed on the top surface, and a planar gate electrode 136 is formed over the gate dielectric 125-P. In FIG. 9D body region 140, source region 130 and lightly doped source region 133 are formed at the top of the semiconductor region.

As mentioned earlier, the IGBT device may also have a closed cell layout. FIG. 10A shows a schematic top view of a possible closed cell layout of an IGBT device of this invention. FIG. 10A shows a single IGBT hexagonal closed cell 200, which can have a cross sectional structure somewhat similar to that shown in FIG. 5. Closed cell 200 may have neighboring cells, but those are not shown in this figure for simplicity. At the center of the cell is the P+ body contact region 142. Surrounding the P+ body contact region 142 is the N+ source region 130. Surrounding the N+ source region 130 is the P-body region 140. Surrounding the P-body region 140 is the (surface portion of) heavily doped N region 145. Surrounding the heavily doped N region 145 is the shield trench 135-S. On top of the semiconductor substrate is the planar gate 136, which has been made transparent in FIG. 10A for clarity, and the outline of which is indicated by the heavy dashed lines. The planar gate 136 shown in this layout extends from about the outer edge of the source region 130 to beyond the shield trench 135-S. Alternatively, it may just extend across the P-body region 140 from the N+ source region 130 to the heavily doped N-type region 145. An emitter electrode (not shown) can make contact to the N+ source region 130 and the P+ body contact region 142.

FIG. 10B shows a top view of the same closed cell 200 as FIG. 10A, except in this drawing, the planar gate 136 is shown as a solid and covers the underlying layers—the outlines of the structures beneath planar gate 136 are marked by thin dashed lines.

The planar gate 136 can extend outwards beyond a single closed cell to neighboring IGBT closed cells, to form a honeycomb shaped network of planar gate 136. The shield trenches may also be shared or connected to neighboring closed cells to form a honeycomb-like network. In such a case, the shield electrode in the shield trench 135-S may be connected to the emitter voltage outside of the closed cell shown in FIGS. 10A-10B, e.g., outside of the active area. Alternatively, an emitter electrode may make a contact to the shield electrode within the closed cell through a break in the planar gate (not shown).

In an alternative embodiment similar to closed cell 200 of FIG. 10A, an IGBT hexagonal closed cell 200' in FIG. 10C has a planar gate 136 that extends from N+ source region 130 to heavily doped N-type region 145. However in this case, the planar gate 136 does not extend beyond the shield trench 135-S, but instead is connected to neighboring closed cells through planar gate spoke structures 136-SP. The spoke structures 136-SP may connect the planar gate 136 of this cell to the planar gates of neighboring cells.

The top views of FIGS. 11A-11D illustrate a basic process for forming a closed cell IGBT like that shown in FIG. 10A. In FIG. 11A, a semiconductor substrate is provided including a P-type lower layer (not shown), an N-type upper (e.g. epi) layer (not shown) over the P-type lower layer, and a heavily doped N-type region 145 formed at the top of the N-type upper layer. By way of example, the heavily doped N-type region 145 may be formed all throughout the active area. In FIG. 11B, shield trenches 135-S are formed in the closed cell in a hexagonal shape. Next, in FIG. 11C, a planar gate 136 structure is formed over the semiconductor substrate. The outline of the shield trench 135-S under the planar gate 136 is indicated in FIG. 11C by thin dashed lines. Next, in FIG. 11D, the body region 140, source region 130, and body contact region 142 are formed; they can be formed self-aligned to the inner edge of the planar gate 136 (the planar gate 136 is made transparent in FIG. 11D for clarity, but its outline is indicated by thick dashed lines). By way of example, the regions formed in FIG. 11D may be formed by implantation and diffusion. The body 140 and body contact regions 142 may be formed without masking in the active area. The source region 130 may be formed using a mask to define the inner boundary of the source region 130.

In essence, this invention discloses an insulated gate bipolar transistor (IGBT) device formed in a semiconductor substrate comprising a bottom collector region and top emitter region with a current channel formed in a body/emitter region and a source-dopant drift region. The IGBT device further comprises a shield gate trench comprising an insulation layer padded trench filled with an upper gate segment and a lower shield segment separated by an inter-segment insulation layer and a dummy trench disposed at a distance away from the shield gate trench. In one embodiment, the body/emitter region extended between the shield gate trench and the dummy trench, encompassing the source region adjacent to the shield gate trench gate near a top surface of the semiconductor substrate. In another embodiment, the IGBT device further includes a heavily doped N+ region extended between the shield gate trench and the dummy trench below the body/emitter region and above the source-dopant drift region above the bottom collector region. In one embodiment, the body/emitter region formed between the shield gate trench and the dummy trench may further extend vertically to approximately the same depth as the upper gate segment in the semiconductor substrate. In one embodiment, the heavily doped N region disposed below the body/emitter region may further extend vertically to a depth approximately the same as the lower shield segment. In one embodiment, the body/emitter region is a P-dopant region and the source region is an N-dopant source region. In another embodiment, the body/emitter region is an N-dopant region and the source region is a P-dopant source region. In one embodiment, the lower shield segment is padded by a thick gate insulation layer over a bottom surface of the shield gate trench. In one embodiment, the body/emitter region extended between the shield gate trench and the dummy trench encompasses the source region disposed between the shield gate trench and the dummy trench near a top surface of the semiconductor substrate. the upper gate segment further extends over a top surface of the semiconductor substrate above the body/emitter region and extends laterally to the source region to form a planar gate portion.

FIG. 12 is a cross-sectional view showing a whole pitch of an IGBT device 300 according to an alternative embodiment of this invention. Similar to the device 101' of FIG. 5, the device 300 includes dual gates with a planar gate, where the trenches also serve the function of electrical field shield. The IGBT device 300 is formed in semiconductor substrate 105 that has a first conductivity type, e.g., a P type substrate 105. An epitaxial layer 110 of a second conductivity type, e.g., an N-epitaxial (epi) layer 110, is supported on top of the P-type substrate 105. The IGBT 300 is a vertical IGBT device with a collector electrode 120 disposed on a bottom surface of the substrate and an emitter electrode disposed on a top surface of the substrate (not shown). The IGBT device shown in the FIG. 12 has a dual gate structure. One planar gate segment is the polysilicon 136-P on top of the gate insulation layer 125-P. The trench gate segment 137 is encapsulated from the semiconductor substrate by vertical gate oxide 125-V that may have oxide thickness of approximately 1000 Angstroms, where the planar gate oxide portion 125-P insulates the planar gate segment 136-P from the semiconductor surface. This planar gate is physically connected to the gate electrode of the IGBT, which control the turn on and turn off of the IGBT device. The other gate segment is the trench gate. One approach to form the trench gate is to connect the trench polysilicon 137 in trench 135'-1 under the planar gate 136-1-P to the gate electrode of the device. The other polysilicon layer 137 in trench 135-'2 at the edge of the whole pitch of the device is connected to the source and serve the electrical field shield function.

Alternatively, the trench gate may be formed by connecting the trench polysilicon 137 in trench 135'-1 and some of the trench polysilicon 137 in some of the trenches 135'-2 to gate electrode. The other trench polysilicon 137 filled in the other trenches 135'-2 not connected to gate should be all connected to source and serve the electrical field shield function. Therefore, the CISS and CRSS of the IGBT can be well controlled in a wide range to satisfy different switch speed requirements.

The IGBT device 300 has an advantage that the trench gates and the trench shield functions together with the doped N region 145 can achieve improved conduction with lower Eoff and Eon losses. The presence of heavily doped N region increases carrier concentration near the topside region of this device, thereby lowering Vce,sat without increasing carrier injection level and Eoff. The Vce,sat is further reduced because the trench gates for an accumulation layer. The heavily doped N region improves the conductivity modulation of the device by making the carrier profile more uniform during conductivity modulation by puffing the heavily doped N region having many majority carriers at the top of the drift/epi region, where the minority carrier concentration usually drops off. Furthermore, the dual gates configuration further has an advantage that the gate ringing and overshoot voltage are reduced during hard switch by increased CISS and CRSS.

FIG. 13 is a cross-sectional view showing a whole pitch of an IGBT device 302 according to another embodiment of this invention. Device 302 is similar to the device 300 of FIG. 12, except that it also includes floating buried P-type rings 155 formed at the bottom of the trenches 135'-2. Beside the advantages of the device 300 as described above, the IGBT device 302 has another advantage that the floating buried P-type rings 155 achieves a better Vce,sat and BV trade off, in particular, the shield to the device is improved, the doping concentration of the doped N region 145 can be increased and the floating buried P-type ring 155 also participates modulation. Furthermore, the device UIS ruggedness also improved without any sacrifice of Vce,sat, BV and Eoff.

FIG. 14A shows a cross sectional perspective view of an IGBT device 302 of FIG. 13. As shown in this figure, the planar gate 136-P runs substantially perpendicularly to the shield trenches 135'-1 and 135'-2, for example, the planar gate 136-P runs in the X-axis direction, while the trench 135'-1 and 135'-2 run in the Z-axis direction. Also, as shown in FIG. 14A, the floating buried P-type ring 155 is formed in a stripe aligned with the trench 135'-2 running in the Z-direction. In an alternative embodiment as shown in FIG. 14B, in the IGBT device 302', the floating buried P-type rings 155 are formed in islands at the selected locations within the trench 135'-2 in the Z direction. FIG. 14C is a top view showing the two patterns of the islands to form the floating buried P-type rings.

FIG. 14D is a top view showing the close-cell IGBT structure 400 with floating buried P-type rings and FIG. 14D-1 is a cross sectional view along the line AA' of FIG. 14D. The close-cell IGBT structure 400 is similar to the close-cell IGBT structure 200 of FIG. 10A, which is a single IGBT hexagonal closed cell. At the center of the cell is the P+ body contact region 142. Surrounding the P+ body contact region 142 is the N+ source region 130. Surrounding the N+ source region 130 is the P-body region 140. Surrounding the P-body region 140 is the (surface portion of) heavily doped N region 145. Surrounding the heavily doped N region 145 is the shield trench 135-S. On top of the semiconductor substrate is the planar gate 136, which has been made transparent in this figure for clarity, and the outline of which is indicated by the heavy dashed lines. An emitter electrode (not shown) can make contact to the N+ source region 130 and the P+ body contact region 142. As shown in FIG. 14, the trench 135'-2 in the center of the Hexagon, inside the P+ body contact region 142, is a hexagonal or round hole, under which the floating buried P-type ring 155 is formed by implant. The trench/hole 135'-2 is lined with an oxide 125 and filled with polysilicon 137 that is connected to the source metal (not shown). The hexagonal or round hole shape trench 135'-2 can be formed at the same time and having a width and depth substantially the same as trench 135'-1.

FIGS. 15A-15G are cross sectional views illustrating a process of forming a device of the type depicted in FIG. 13. FIG. 15A shows a starting semiconductor substrate including a (P-type) bottom semiconductor layer 105 with an (N-type) semiconductor top layer 110 of opposite conductive type located thereon. In FIG. 15B, trenches 135'-1 and 135'-2 are etched into the top semiconductor layer 110. In FIG. 15C, the trenches are lined with a dielectric (e.g. oxide) 126 and shield electrodes 137 are formed filling most of the trenches 135'-1 and 135'-2 followed by the planarization of the shield electrode 137 either by CMP or etch back. In FIG. 15D, a heavily doped layer 145 is formed in the upper layer 110 and extends to the bottom of the trenches 135'-1 and 135'-2. Optionally, the heavily doped layer 145 could also be formed earlier in the process. In FIG. 15E, the floating buried P-type ring is implanted under the trench 135'-2, either in a strip or selected islands as shown in FIGS. 14A-14B. In FIG. 15F, a gate dielectric 125-P is formed on the top surface of the trenches 135'-1, and a planar gate electrode 136-P is formed over the gate dielectric 125-P. In FIG. 15G body region 140, source region 130 and highly doped P+ body contact region 142 are formed at the top of the semiconductor region. The manufacturing process proceeds with standard processing steps to complete the devices.

Although the present invention has been described in terms of the presently preferred embodiment, it is to be understood that such disclosure is not to be interpreted as limiting. For example, though the conductivity types in the examples above often show an n-channel device, the invention can also be applied to p-channel devices by reversing the polarities of the conductivity types. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. An insulated gate bipolar transistor (IGBT) device comprises:
    a semiconductor substrate comprising an epitaxial layer of a first conductivity type supported on a bottom layer of a second conductivity type electrically contacting a collector electrode disposed on a bottom surface of the semiconductor substrate;
    a body region of the second conductivity type disposed near a top surface of the semiconductor substrate encompassing a source region of the first conductivity type below a top surface of the semiconductor substrate;
    a first trench on a first side of the source region etching into the epitaxial layer through the body region, a dielectric layer lining a bottom and side walls of the first trench insulating a lower trench electrode and an upper trench electrode disposed inside the first trench from the epitaxial layer, the upper trench electrode being separated from the lower trench electrode by an inter-segment dielectric layer;
    a planar insulated gate disposed above the top surface of the semiconductor substrate, the planar insulated gate extending from the first trench to overlaying a portion of the source region.

2. The IGBT device of claim 1 wherein:
    the dielectric layer lining the bottom and side walls of the first trench comprises a thicker portion surrounding the lower trench electrode and a thinner portion surrounding the upper electrode.

3. The IGBT device of claim 1 further comprises a second trench disposed on a second side of the source region opposite the first side, a dielectric layer lining a bottom and side walls of the second trench insulating an electrode disposed inside the second trench from the epitaxial layer.

4. The IGBT device of claim 3 wherein:
    the electrode disposed inside the second trench is electrically connected to the source region.

5. The IGBT device of claim 4 wherein:
    the electrode disposed inside the second trench extends from approximate a top surface of the semiconductor substrate to a bottom of the second trench.

6. The IGBT device of claim 5 wherein:
    the lower trench electrode in the first trench is electrically connected to the source region.

7. The IGBT device of claim 1 wherein:
    the upper trench electrode being electrically connected to the planar insulated gate disposed above the top surface of the semiconductor substrate.

8. The IGBT device of claim 7 wherein:
    The planar gate overlaps a portion of the body region between the source region and the first trench.

9. The IGBT device of claim 7 wherein:
    the epitaxial layer further includes an upper heavily doped layer having a higher dopant concentration of the first conductivity type below the body region.

10. The IGBT device of claim 9 wherein:
    the upper heavily doped layer extends vertically from a bottom of the body region to a depth approximate the lower trench electrode.

11. An insulated gate bipolar transistor (IGBT) device comprises:
    a semiconductor substrate comprising an epitaxial layer of a first conductivity type supported on a bottom layer of a second conductivity type electrically contacting a collector electrode disposed on a bottom surface of the semiconductor substrate;
    a body region of the second conductivity type disposed near a top surface of the semiconductor substrate encompassing a source region of the first conductivity type below a top surface of the semiconductor substrate;
    a first trench disposed on a first side of the source region etching into the epitaxial layer through the body region, a dielectric layer lining a bottom and side walls of the first trench insulating a lower trench electrode and an upper trench electrode disposed inside the first trench from the epitaxial layer, the upper trench electrode being separated from the lower trench electrode by an inter-segment dielectric layer;
    a second trench disposed on a second side of the source region opposite the first side etching into the epitaxial layer through the body region, a dielectric layer lining a bottom and side walls of the second trench insulating an electrode disposed inside the second trench from the epitaxial layer.

12. The IGBT device of claim 11 wherein:
    the dielectric layer lining the bottom and side walls of the second trench comprises a thicker portion lining a bottom portion of the second trench and a thinner portion lining an upper portion of the second trench.

13. The IGBT device of claim 12 wherein:
    the electrode disposed inside the second trench extends continuously from approximate a top surface of the semiconductor substrate to a bottom of the second trench.

14. The IGBT device of claim 12 wherein:
    the electrode disposed inside the second trench is electrically connected to the source region.

15. The IGBT device of claim 12 wherein:
    the second trench is separated from the source region.

16. The IGBT device of claim 12 wherein:
the first trench is adjacent to the source region.
17. The IGBT device of claim 12 wherein:
the first trench is separated from the source region.
18. The IGBT device of claim 12 further comprising:
the epitaxial layer further includes an upper heavily doped layer below the body region having a higher dopant concentration of the first conductivity type than the epitaxial layer of the first conductivity type disposed above the bottom layer of the second conductivity type.
19. The IGBT device of claim 12 wherein:
the epitaxial layer of the first conductivity type is an N-type epitaxial layer supported on a bottom layer of a P-type conductivity type.
20. The IGBT device of claim 12 wherein:
The lower trench electrode in the first trench is electrically connected to the source region.

\* \* \* \* \*